US012363406B2

United States Patent
Cho et al.

(10) Patent No.: US 12,363,406 B2
(45) Date of Patent: Jul. 15, 2025

(54) CAMERA MODULE FOR HEAT DISSIPATION AND GROUND AND ELECTRONIC DEVICE INCLUDING THE SAME

(71) Applicant: SAMSUNG ELECTRONICS CO., LTD., Suwon-si (KR)

(72) Inventors: Minki Cho, Suwon-si (KR); Jungsoo Kim, Suwon-si (KR); Dohyun Ahn, Suwon-si (KR); Wonchul Cho, Suwon-si (KR); Taeyun Kim, Suwon-si (KR); Wonjun Jeong, Suwon-si (KR); Kwangsic Choi, Suwon-si (KR); Chonguk Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 178 days.

(21) Appl. No.: 17/816,759

(22) Filed: Aug. 2, 2022

(65) Prior Publication Data

US 2023/0098815 A1 Mar. 30, 2023

Related U.S. Application Data

(63) Continuation of application No. PCT/KR2022/008056, filed on Jun. 8, 2022.

(30) Foreign Application Priority Data

Sep. 24, 2021 (KR) .................. 10-2021-0126777

(51) Int. Cl.
*H04N 23/52* (2023.01)
*G03B 5/00* (2021.01)
(Continued)

(52) U.S. Cl.
CPC ............. *H04N 23/52* (2023.01); *G03B 17/02* (2013.01); *G03B 17/55* (2013.01); *G03B 30/00* (2021.01);
(Continued)

(58) Field of Classification Search
CPC ...... H04N 23/52; H04N 23/54; H04N 23/687; H04N 23/51; H04N 23/55; H04N 23/57;
(Continued)

(56) References Cited

U.S. PATENT DOCUMENTS 8,866,919 B2   10/2014   Ahn et al.
9,154,674 B2   10/2015   Lee
(Continued)

FOREIGN PATENT DOCUMENTS

CN    213547633 U    6/2021
JP    2008-211378    9/2008
(Continued)

OTHER PUBLICATIONS

Search Report and Written Opinion dated Sep. 15, 2022 issued in International Patent Application No. PCT/KR2022/008056.
(Continued)

*Primary Examiner* — Twyler L Haskins
*Assistant Examiner* — Akshay Trehan
(74) *Attorney, Agent, or Firm* — Nixon & Vanderhye, P.C.

(57) ABSTRACT

A camera module includes: a printed circuit board having a conductive pad exposed on one surface of the printed circuit board, an image sensor disposed on the printed circuit board, a conductive plate disposed between the printed circuit board and the image sensor and electrically connected to the conductive pad, an actuator disposed above the image sensor and configured to adjust a position of a lens assembly, and a shield can surrounding the actuator and electrically con-
(Continued)

nected to the conductive plate. The conductive plate is configured to emit heat generated from the image sensor to the outside of the camera module by contact with the image sensor.

20 Claims, 21 Drawing Sheets

(51) Int. Cl.
*G03B 17/02* (2021.01)
*G03B 17/55* (2021.01)
*G03B 30/00* (2021.01)
*H04N 23/54* (2023.01)
*H04N 23/55* (2023.01)
*H04N 23/57* (2023.01)
*H05K 1/02* (2006.01)
*H05K 1/14* (2006.01)
*H05K 7/20* (2006.01)
*H05K 9/00* (2006.01)

(52) U.S. Cl.
CPC ............. *H04N 23/54* (2023.01); *H04N 23/55* (2023.01); *H04N 23/57* (2023.01); *H05K 1/0218* (2013.01); *H05K 7/20* (2013.01); *H05K 7/20509* (2013.01); *H05K 9/00* (2013.01); *H05K 9/0024* (2013.01); *G03B 5/00* (2013.01); *H05K 1/147* (2013.01); *H05K 2201/10121* (2013.01); *H05K 2201/10151* (2013.01)

(58) Field of Classification Search
CPC ........ G03B 17/55; G03B 17/02; G03B 30/00; G03B 2217/00; G03B 2217/002; G03B 5/00; G03B 5/02; G03B 5/04; G03B 2205/0007; G03B 2205/0015; G03B 2205/0038; G03B 2205/0053; G03B 2205/0069; G02B 27/64; G02B 27/646; H05K 1/0218; H05K 1/147; H05K 7/20; H05K 7/20509; H05K 9/00; H05K 9/0024; H05K 2201/10121; H05K 2201/10151
See application file for complete search history.

(56) References Cited

U.S. PATENT DOCUMENTS

| | | | |
|---|---|---|---|
| 9,179,053 | B2 | 11/2015 | Takeshita et al. |
| 10,531,599 | B2 | 1/2020 | Mun et al. |
| 10,951,798 | B2 | 3/2021 | Ma et al. |
| 11,388,276 | B2 | 7/2022 | Huh et al. |
| 11,405,540 | B2 | 8/2022 | Lee et al. |
| 11,445,637 | B2 | 9/2022 | Jung et al. |
| 2010/0158508 | A1* | 6/2010 | Kim ...................... H04N 23/57 396/529 |
| 2013/0093948 | A1* | 4/2013 | Takeshita ............... H04N 23/54 348/374 |
| 2017/0042058 | A1* | 2/2017 | Pope ................... H01L 23/3735 |
| 2019/0246490 | A1 | 8/2019 | Li et al. |
| 2019/0349507 | A1* | 11/2019 | Lee ........................ H04N 23/54 |
| 2020/0322467 | A1* | 10/2020 | Huh ....................... G06F 1/1658 |

FOREIGN PATENT DOCUMENTS

| | | | | |
|---|---|---|---|---|
| JP | 2012-47816 | | 3/2012 | |
| JP | 5473261 | A | 2/2014 | |
| KR | 10-0876109 | | 12/2008 | |
| KR | 10-0897799 | | 5/2009 | |
| KR | 10-2011-0030091 | | 3/2011 | |
| KR | 20110030091 | A * | 3/2011 | ......... H05K 13/0465 |
| KR | 10-1327622 | | 11/2013 | |
| KR | 10-1338803 | | 12/2013 | |
| KR | 10-2014-0000078 | | 1/2014 | |
| KR | 10-2018-0074223 | | 7/2018 | |
| KR | 101879661 | | 7/2018 | |
| KR | 101879661 | B1 * | 7/2018 | ............. G03B 17/02 |
| KR | 10-2020-0117553 | | 10/2020 | |
| WO | 2012/137267 | | 10/2012 | |

OTHER PUBLICATIONS

Extended Search Report dated Oct. 4, 2024 in European Patent Application No. 22873063.6.

* cited by examiner

CAMERA MODULE FOR HEAT DISSIPATION AND GROUND AND ELECTRONIC DEVICE INCLUDING THE SAME

CROSS-REFERENCE TO RELATED APPLICATIONS

This application is a continuation of International Application No. PCT/KR2022/008056 designating the United States, filed on Jun. 8, 2022, in the Korean Intellectual Property Receiving Office and claiming priority to Korean Patent Application No. 10-2021-0126777, filed on Sep. 24, 2021, in the Korean Intellectual Property Office, the disclosures of which are incorporated by reference herein in their entireties.

BACKGROUND

Field

The disclosure relates to a camera module for heat dissipation and ground and an electronic device including the same.

Description of Related Art

Demand for electronic devices (e.g., smartphones or tablet PCs) including camera modules is increasing. Since various electronic components are disposed inside the electronic device, signal crosstalk or signal interference due to electromagnetic waves between the camera module and other electronic components may occur.

As the resolution and pixels of the camera module increase, radiation problems such as electromagnetic interference (EMI) and electromagnetic susceptibility (EMS) and heat dissipation problems are emerging.

Since the distance between the electronic components mounted inside the electronic device becomes closer according to the miniaturization trend, an electronic device is required to have a structure for shielding electromagnetic interference generated between electronic components. To reduce electromagnetic interference between a plurality of electronic components, malfunction due to noise, and deterioration of signal quality, the electronic device is required to design a grounding pad on the circuit board. The camera module may generate an electromagnetic wave when operating an actuator for driving the lens assembly. The electromagnetic wave of the camera module may affect other electronic components of the electronic device, thereby generating noise or causing a malfunction of the electronic device. In addition, as the performance of the camera module is improved, the power consumption of the image sensor may increase. Heat may be generated by power consumed by the image sensor. The camera module is required to have a structure capable of properly adjusting the internal temperature by dissipating heat generated from the image sensor.

SUMMARY

According to an example embodiment, a camera module may comprise: a printed circuit board including a conductive pad exposed on one surface; an image sensor disposed on the printed circuit board; a conductive plate disposed between the printed circuit board and the image sensor and electrically connected to the conductive pad; an actuator disposed above the image sensor and configured to adjust a position of a lens assembly; and a shield can surrounding the actuator and electrically connected to the conductive plate; wherein the conductive plate may be configured to emit heat generated from the image sensor to an outside of the camera module by contact with the image sensor.

According to an example embodiment, an electronic device may comprise: a camera module comprising a camera mounted on the electronic device; a support disposed to surround the camera module and supporting a bracket configured to fix the camera module to the inside of the electronic device, wherein the camera module may include a conductive pad exposed on one surface of a printed circuit board; an image sensor disposed on the printed circuit board; a conductive plate disposed between the printed circuit board and the image sensor and electrically connected to the conductive pad; an actuator disposed above the image sensor and configured to adjust a position of a lens assembly; and a shield can surrounding the actuator, wherein the conductive plate may be electrically connected to the bracket and may be configured to emit heat generated from the image sensor to an outside of the camera module by contact with the image sensor.

Since a sufficient ground surface can be secured through the conductive plate, the camera module for heat dissipation and ground can effectively shield electromagnetic waves generated when the actuator is driven. The camera module for heat dissipation and ground can improve heat dissipation performance by transferring heat generated from the image sensor by the conductive plate to at least one of a shield can and a bracket, and a printed circuit board.

The effects that can be obtained from the present disclosure are not limited to those described above, and any other effects not mentioned herein will be clearly understood by those having ordinary knowledge in the art to which the present disclosure belongs, from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
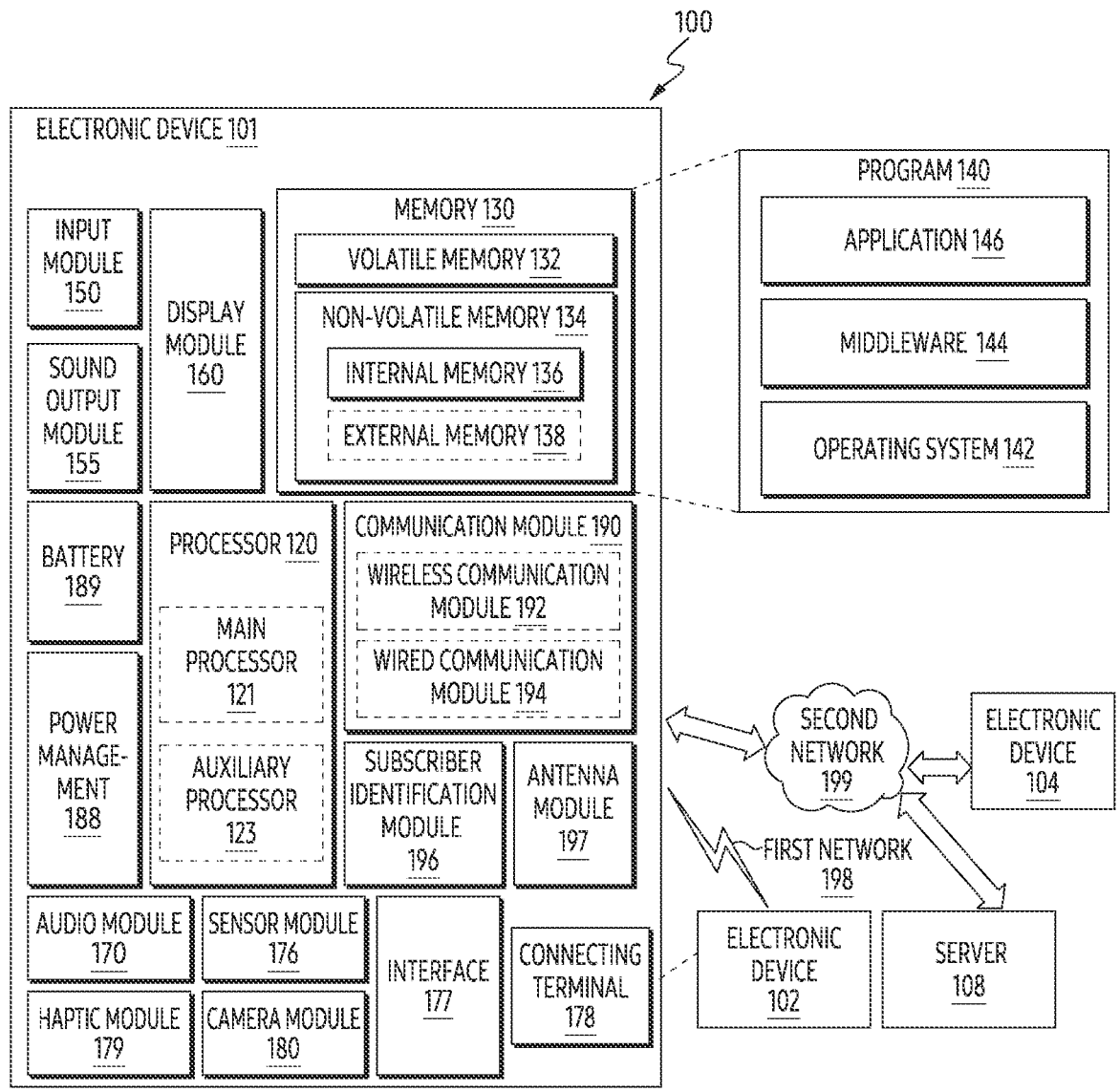
FIG. 1 is a block diagram of an electronic device in a network environment according to an embodiment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultralow-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
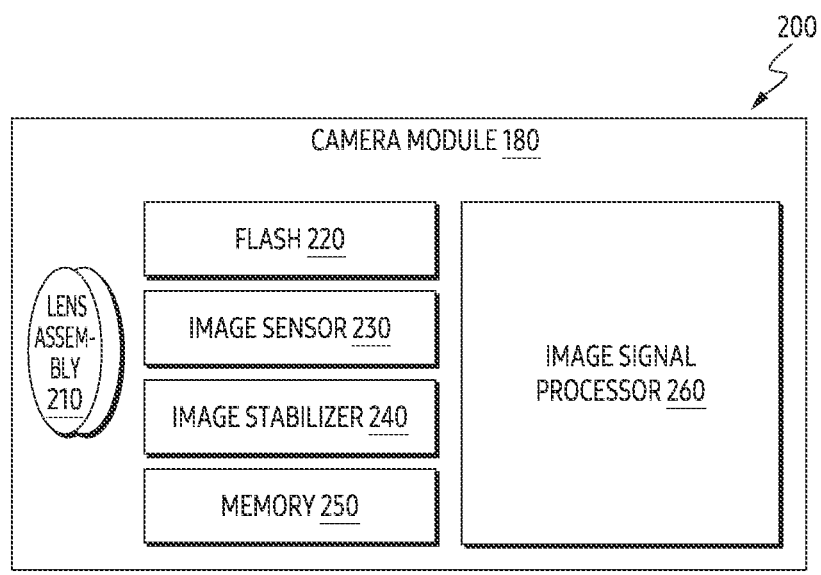
FIG. 2 is a block diagram illustrating a camera module according to an embodiment.

FIG. 2 is a block diagram 200 illustrating the camera module 180 according to various embodiments.

Referring to FIG. 2, the camera module 180 may include a lens assembly (e.g., including at least one lens) 210, a flash 220, an image sensor 230, an image stabilizer 240, memory 250 (e.g., buffer memory), and/or an image signal processor (e.g., including processing circuitry) 260. The lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light reflected from an object. According to an embodiment, the flash 220 may include one or more light emitting diodes (LEDs) (e.g., a red-green-blue (RGB) LED, a white LED, an infrared (IR) LED, or an ultraviolet (UV) LED) or a xenon lamp. The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer.

The memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display device 160. Thereafter, if a specified condition is met (e.g., by a user's input or system command), at least part of the raw image stored in the memory 250 may be obtained and processed, for example, by the image signal processor 260.

According to an embodiment, the memory 250 may be configured as at least part of the memory 130 or as a separate memory that is operated independently from the memory 130.

The image signal processor 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may perform control (e.g., exposure time control or read-out timing control) with respect to at least one (e.g., the image sensor 230) of the components included in the camera module 180. An image processed by the image signal processor 260 may be stored back in the memory 250 for further processing, or may be provided to an external component (e.g., the memory 130, the display device 160, the electronic device 102, the electronic device 104, or the server 108) outside the camera module 180. According to an embodiment, the image signal processor 260 may be configured as at least part of the processor 120, or as a separate processor that is operated independently from the processor 120. If the image signal processor 260 is configured as a separate processor from the processor 120, at least one image processed by the image signal processor 260 may be displayed, by the processor 120, via the display device 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

Figure 3A:
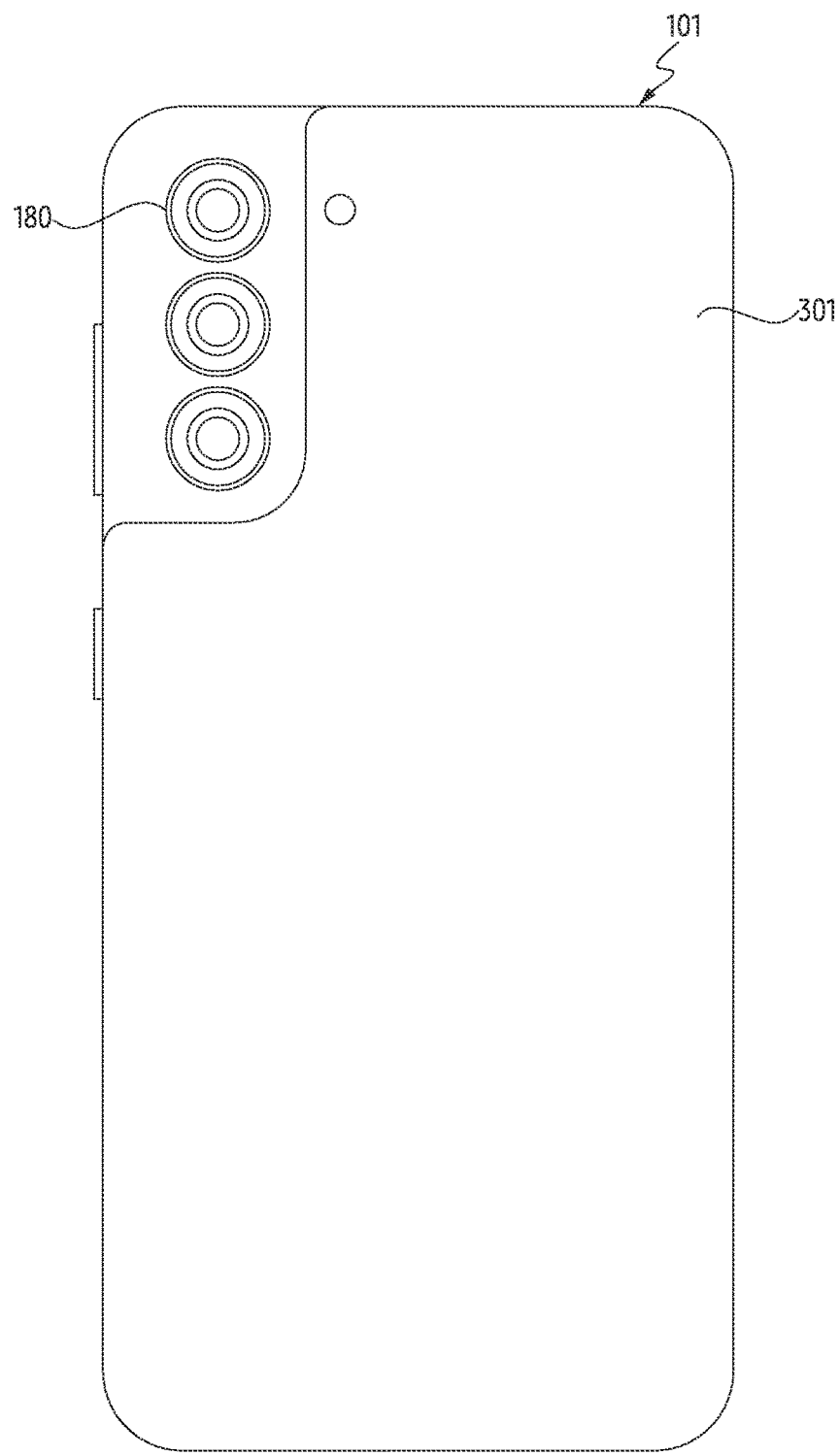
FIG. 3A is diagram illustrating an example of an electronic device according to an embodiment.

FIG. 3A is a diagram illustrating an example of an electronic device according to an embodiment.

Referring to FIG. 3A, according to an embodiment, the electronic device (e.g., the electronic device 101 of FIG. 1) may include at least one camera module including a camera (e.g., the camera module 180 of FIG. 1). For example, the electronic device 101 may be a mobile terminal including a front camera and a rear camera. A user of the electronic device 101 may take pictures and videos using the camera module 180 included in the electronic device 101, store image information and video information in a memory, and transmit image information and video information to the outside of the electronic device 101. The electronic device 101 may include electronic components that perform various functions in addition to the camera module 180. Each of the electronic components may be disposed at a designated location inside the electronic device 101 to perform a designated function.

According to an embodiment, at least a part of the camera module 180 may be exposed through an opening formed in the rear plate 301 facing a display (not shown) disposed on the front surface of the electronic device 101. The camera module 180 may include cameras having different functions. For example, the camera module 180 may include at least one of a depth camera, a wide-angle camera, an ultra-wide-angle camera, and a telephoto camera.

Figure 3B:
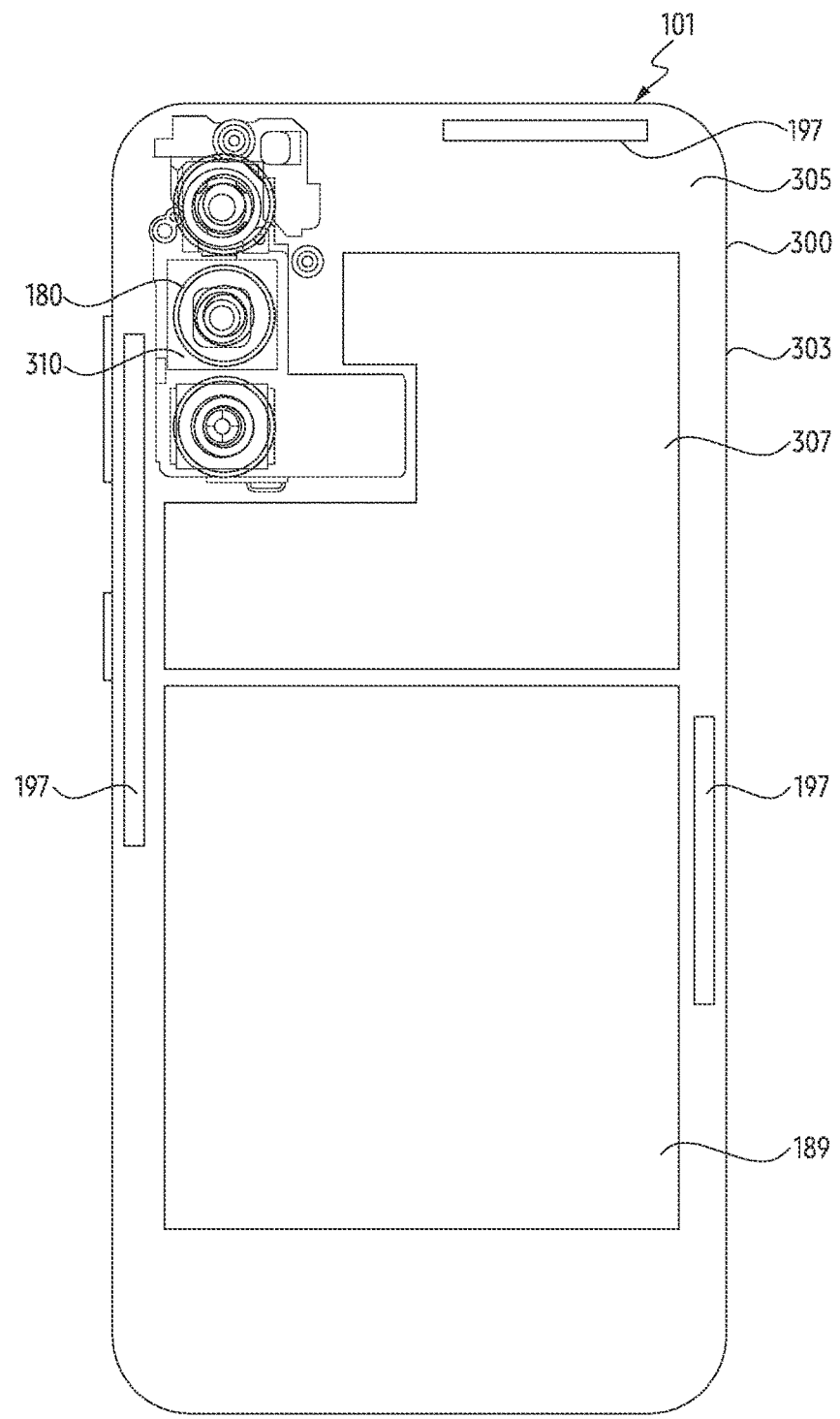
FIG. 3B is a diagram illustrating a state in which a rear plate of an electronic device is removed, according to an embodiment.

FIG. 3B is diagram illustrating a rear view of a state in which a rear plate of an electronic device is removed, according to an embodiment.

Referring to FIG. 3B, according to an embodiment, the electronic device 101 may include a camera module 180, a battery (e.g., the battery 189 of FIG. 1) supplying power to electronic components, at least one antenna module including at least one antenna (e.g., the antenna module 197 of FIG. 1) that transmits a signal or power to the outside of the electronic device 101 or receives the signal or power from the outside, and a printed circuit board 307 electrically connected to the electronic components of the electronic device 101.

The housing 300 may include a front surface on which the display is disposed, a rear surface and a side surface 303 on which the rear plate 301 is disposed, and the front surface, the rear surface, and the side surface 303 may surround an internal space. The housing 300 may further include a support member (e.g., a support) 305 extending from the side surface 303 to support components (e.g., the camera module 180, the printed circuit board 307, the battery 189 and/or the antenna module 197) of the electronic device 101. The support member 305 may be integrally formed with the side surface 303 but is not limited thereto. The support member 305 may be coupled to a part of the structure of the housing 300 forming the side surface 303.

The electronic device 101 may include a bracket 310 for fixing the camera module 180 to a specific position inside the electronic device 101 by supporting the camera module 180. The bracket 310 may be disposed on the support member 305. The bracket 310 may be configured to surround the camera module 180. The bracket 310 surrounding the camera module 180 may be mounted at a designated position inside the electronic device 101 to fix the camera module 180 at a designated position of the electronic device 101.

In general, as various electronic components are mounted on an electronic device, the camera module is required to manage radiation such as electromagnetic interference and electromagnetic sensitivity. The camera module 180 may include an actuator therein. The actuator may adjust the position of the lens assembly to adjust the focus of the lens of the camera. The actuator may include a magnet or an electromagnet to adjust the position of the lens assembly. When the actuator is driven, electromagnetic waves are generated by a magnet or an electromagnet, and the electromagnetic waves may affect other electronic components mounted on the electronic device, thereby causing communication failure or malfunction. Various electronic components mounted on the electronic device may generate electromagnetic waves and affect the operation of the camera module. For example, an electronic device may include at least one camera module and at least one antenna module, and the camera module and the antenna module may be disposed adjacent to each other in a limited internal space of the electronic device. The electronic device 101 may include a plurality of antenna modules 197 disposed adjacent to the side surface 303 of the housing 300. As the plurality of antenna modules 197 are mounted inside the electronic device 101, electromagnetic waves emitted from the antenna module may affect the camera module 180. Since the camera module 180 and the antenna module are disposed adjacent to each other, electromagnetic waves generated during one operation may affect the other. For example, as the frequency band of the antenna module 197 included in the electronic device 101 increases, noise may be generated due to interference between the antenna module and the camera module 180.

In general, as the resolution and pixels increase, power consumption of the camera module increases, and as a result, heat generated during operation of the camera module may increase. A high-performance image sensor may provide high performance by being driven at a high frame speed, but an internal temperature may increase due to heat generation due to an increase in power consumption. When the internal temperature increases, the image quality of the camera module may deteriorate, electronic components may be damaged, and noise may intensify.

To address the above-described radiation and heat dissipation problems, the camera module is required to secure a sufficient ground plane on the printed circuit board. As the size of the electronic device gradually becomes smaller and the performance of electronic components of the electronic device gradually becomes more advanced, the printed circuit boards are difficult to secure space for disposing the ground plane. Hereinafter, the structure of the camera module 180 for securing the ground plane included in the electronic device 101 will be described according to various example embodiments.

Figure 4A:
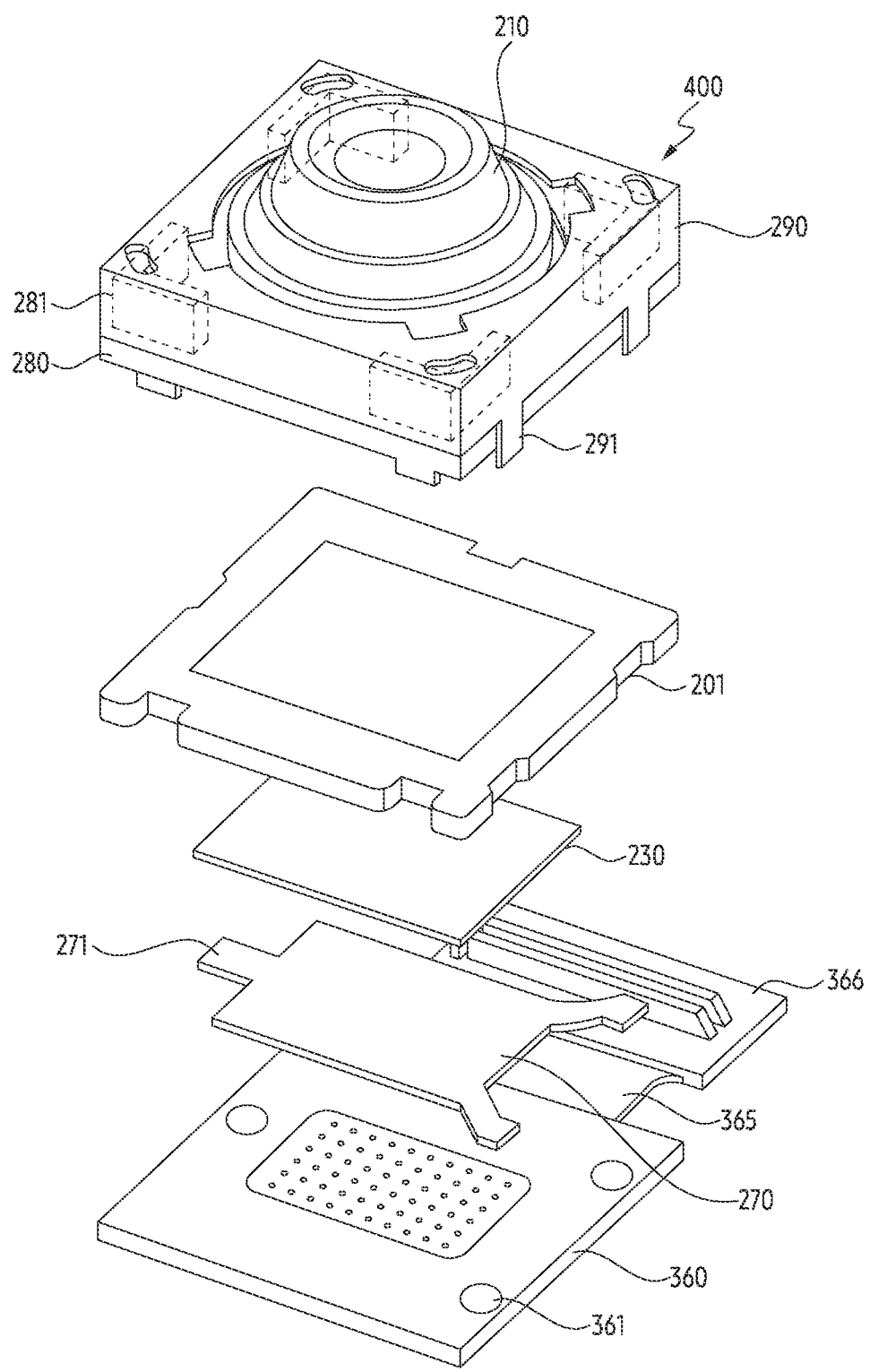
FIG. 4A is an exploded perspective view of a camera module according to an embodiment.

FIG. 4A is an exploded perspective view of a camera module according to an embodiment.

Referring to FIG. 4A, according to an embodiment, a camera module 400 may include a substrate 360, an image sensor 230 disposed on the substrate 360, a conductive plate 270 disposed between the substrate 360 and the image sensor 230, an actuator 280 adjusting the position of the lens assembly 210, and a shield can 290 surrounding the actuator 280. In the camera module 400, a substrate 360, a conductive plate 270, an image sensor 230, an optical filter 201, and the lens assembly 210 may be sequentially disposed from the bottom.

According to an embodiment, the substrate 360 may electrically connect a plurality of components to each other by connecting a plurality of components of the camera module 400. The substrate 360 may be a printed circuit board in which layers on which a conductive pattern is printed are stacked. The substrate 360 may include a pattern for an electrical circuit of the camera module 400 on one surface and a conductive pad 361 for electrical ground of the substrate 360. A plurality of conductive pads 361 may be formed on one surface of the substrate 360. For example, one conductive pad 361 may be disposed adjacent to the center of one corner of the substrate 360 and two conductive pads 361 may be disposed adjacent to both ends of the other corner facing the corner. As another example, the conductive pad 361 may be disposed such that four conductive pads 361 are adjacent to the vertices of the rectangular substrate 360.

According to an embodiment, the conductive pad 361 may function as a ground pad of the substrate 360. The conductive pad 361 may include a copper foil layer 362 (refer to FIG. 7B) connected to a ground point of a circuit printed on the substrate 360.

The conductive pad 361 may reduce electromagnetic waves generated in the circuit from affecting other components. For example, the conductive pad 361 may electrically connect the shield can 290 and the substrate 360. The conductive pad 361 may shield the actuator 280 from electromagnetic waves transmitted from the outside or may shield electromagnetic waves emitted from the actuator 280 by electrically connecting the ground portion of the substrate 360 and the shield can 290. According to an embodiment, the conductive pad 361 may physically contact the conductive plate 270 to emit heat generated from the image sensor 230 or the image processor to the outside. For example, heat generated from the image sensor 230 may be transferred to the substrate 360 through a conductive plate 270 and a conductive pad 361 having high thermal conductivity. The heat transferred to the substrate 360 may be emitted to the outside of the camera module 400 through the substrate 360 or a metal structure or heat dissipation member connected to the substrate 360.

According to an embodiment, the electronic device (e.g., the electronic device 101 of FIG. 1) may further include a flexible printed circuit board 365 electrically connected to the substrate 360 and a connector 366 disposed at the end of the flexible printed circuit board 365. The flexible printed circuit board 365 may include a signal line and a power line extending from the substrate 360. Since the circuit board is made of a flexible material, the flexible printed circuit board 365 may dispose the substrate 360 at various positions. For example, the substrate 360 may be disposed at a different height than the printed circuit board (e.g., the printed circuit board 307 of FIG. 3B). For example, the distance from the display to the printed circuit board 307 may be different from the distance from the display to the substrate 360, and a step may occur between the printed circuit board 307 and the substrate 360. The flexible printed circuit board 365 may electrically connect the substrate 360 disposed at different heights to the printed circuit board 307. The connector 366 may be electrically connected to the signal line and the power line. The signal line may be a conductive line for transmitting a signal transmitted from the camera module 400 to the processor (e.g., the processor 120 of FIG. 1) and/or a signal transmitted from the processor 120 to the camera module 400. The power line may be a conductive line for transferring power required for the camera module 400 from the battery 189. The connector 366 may be electrically connected to the printed circuit board 307 distinguished from the printed circuit board 365. For example, the connector 366 may connect the lines of the printed circuit board 307 to the lines of the flexible printed circuit board 365. As another example, the power line may be connected to the ground portion of the printed circuit board 307. According to an embodiment, the image sensor 230 may convert light passing through the lens assembly 210 into an electrical signal. The image sensor 230 may convert an optical image of a subject photographed through the lens assembly 210 into an electrical image signal. The camera module 400 may display an electrical signal converted from the image sensor 230 on a display or store the electrical signal in a memory. For example, the image sensor 230 may be a charge coupled device (CCD) or a complementary metal oxide semiconductor (CMOS). The image sensor 230 may be electrically connected to the substrate 360. The image sensor 230 may be disposed on the substrate 360 to perform image signal processing. When performing an operation of converting light into an electrical signal, the image sensor 230 may consume power and generate heat according to power consumption. For example, as the resolution of the image sensor 230 increases, the data throughput of the image processor connected to the image sensor 230 and the image sensor 230 may increase. As the data throughput of the image sensor 230 and the image processor increases, heat generation of the image sensor 230 or the image processor may increase.

According to an embodiment, the conductive plate 270 may be disposed between the substrate 360 and the image sensor 230 and may be electrically connected to the conductive pad 361. The conductive plate 270 may include conductive materials including a plurality of charged particles that may freely move when the electric field is applied, and a material having high thermal conductivity. For example, the conductive plate 270 may include a metal material having high electrical conductivity and thermal conductivity, such as silver, copper, aluminum, or stainless steel, but is not limited thereto.

The conductive plate 270 may be in contact with the image sensor 230. The image sensor 230 may be disposed on the conductive plate 270. Heat generated from the image sensor 230 or the image processor may be transferred to the conductive plate 270 in contact with the image sensor 230. Since the conductive plate 270 includes a material having high thermal conductivity, heat generated by the operation of the image sensor 230 may be rapidly conducted. For example, the conductive plate 270 may radiate heat generated from the image sensor 230 to the outside of the camera module 400 by contact with the image sensor 230. The conductive plate 270 may be in physical direct contact with the image sensor 230 or may be in indirect contact by being connected through another heat transfer member. Heat generated by the image sensor 230 or the image processor may be transferred to the conductive plate 270 and then discharged to the outside of the camera module 400 through the shield can 290 and/or the substrate 360.

According to an embodiment, the actuator 280 may adjust the position of the lens assembly 210. The actuator 280 may adjust the position of the lens assembly 210 for auto-focusing on the image sensor 230. Since the position of the lens assembly 210 is adjusted by the actuator 280, the focal length of the lens assembly 210 may be changed. For example, the actuator 280 may adjust the distance between the lens assembly 210 and the image sensor 230 or move the position of the lens assembly 210 to the optimal focal position. In order to transmit the optical image of the subject to the image sensor 230, the lens assembly 210 and the actuator 280 may be disposed on the image sensor 230. The actuator 280 may include a plurality of operating members 281 that adjust the position of the lens assembly 210 by being operatively coupled to the lens assembly 210. For example, the actuator 280 may include a coil wound around the outer circumferential surface of the lens assembly 210 and a magnet disposed to face the coil. The actuator 280 may move the lens assembly 210 using an electromagnetic force generated between an electric field by a current flowing in the coil and a magnetic field by a magnet.

According to an embodiment, the shield can 290 may be disposed to surround the actuator 280 for electromagnetic wave shielding. The shield can 290 may have a box shape having an inner space, and the lens assembly 210 may be accommodated in the inner space. The lens assembly 210 may be partially exposed to the upper portion of the shield can 290. The shield can 290 may electrically shield the camera module 400 and protect it from external impact.

The shield can 290 may shield electromagnetic waves emitted from the camera module 400 or transmitted to the camera module by being grounded. The shield can 290 may block electromagnetic waves generated from the camera module 400 from being emitted to the outside and may block electromagnetic waves from being transmitted to the camera module 400 from the outside of the camera module 400. The shield can 290 may reduce electromagnetic waves generated during an operation of the actuator 280 from being emitted to the outside of the camera module 400 to affect other electronic components and may reduce electromagnetic waves generated from other electronic components from being transmitted to the camera module 400 to affect the operation of the actuator 280 by being disposed to surround the actuator 280. For example, the shield can 290 may reduce the coil of the actuator 280 from being affected by a magnetic field generated from other magnetic materials in addition to a magnetic field generated from a magnet to generate electromagnetic force. For example, the shield can 290 may block the influence of magnetic fields generated from magnetic materials other than the magnetic field generated by the coil of the actuator 280 from the magnet to generate electromagnetic force. The shield can 290 may block the influence of electromagnetic waves by the antenna module 197 located on the side surface 303 adjacent to the camera module 400. The actuator 280 of the camera module 400 may operate stably by blocking electromagnetic waves transmitted from the outside using the shield can 290.

The shield can 290 may include a material having high magnetic permeability, thereby shielding electromagnetic waves generated in the actuator 280 and inducing electromagnetic waves to flow from the outside of the camera module 400 to other parts along the surface of the shield can 290. The shield can 290 may be made of a material for blocking radiation of electromagnetic waves. For example, the shield can 290 may include a metal material such as copper or aluminum. As another example, the shield can (290) may include a composite material in which a filler such as carbon fiber, carbon black, carbon nanotube (CNT), nickel coated graphite, or the like is added to a polymer material.

According to an embodiment, the shield can 290 may be electrically connected to the conductive plate 270. The shield can 290 may be grounded to the substrate 360 by being electrically connected to the conductive plate 270 electrically connected to the conductive pad 361. The shield can 290 may be grounded to the substrate 360 by contacting a portion of the conductive plate 270 electrically connected to the conductive pad 361. For example, the conductive plate 270 may be electrically connected to the conductive pad 361 through a soldering process by surface mount technology (SMT), and the shield can 290 may include a protrusion 291 in which a part of a lower surface is electrically connected to the conductive plate 270. The protrusion 291 may protrude from the lower surface of the shield can 290 to the conductive plate 270 to be in contact with the conductive plate 270. The protrusion 291 may provide a path through which heat is transferred from the conductive plate 270 to the shield can 290. A conductive bond may be applied to the shield can (290) to a part in contact with the conductive plate (270) so as to stably contact the conductive plate (270). By being grounded through the conductive plate 270, the shield can 290 may electromagnetically shield the actuator 280 of the camera module 400 from the outside.

According to an embodiment, the lens assembly 210 may include an optical filter 201 that filters incident light. The optical filter 201 may selectively transmit a part according to the spectrum of light. The optical filter 201 may be disposed between the lens assembly 210 and the image sensor 230. For example, the optical filter 201 may be an infrared filter that blocks infrared rays among the spectra of light passing through the lens assembly 210. In the camera module 400 including the CCD or CMOS, since infrared rays can cause noise and degrade chromatic aberration and resolution, the optical filter 201 may be disposed in front of the image sensor 230 to block infrared rays reaching the image sensor 230.

Figure 4B:
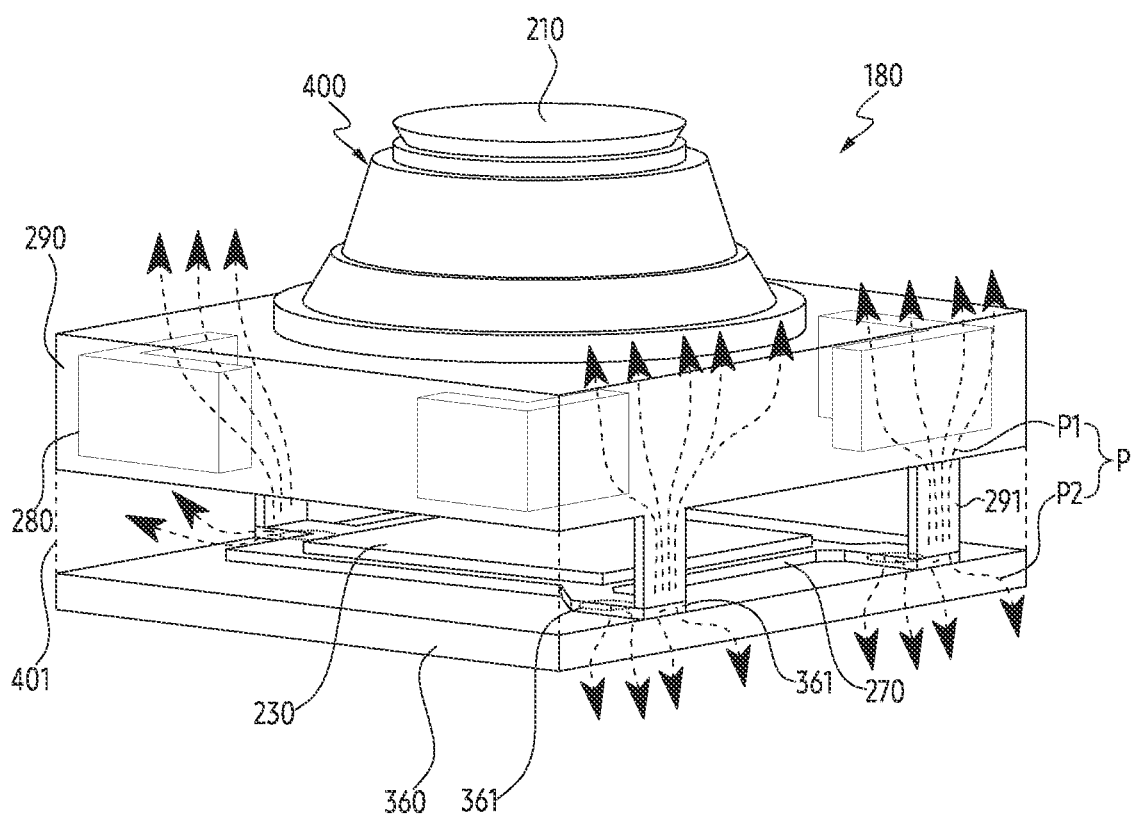
FIG. 4B is a perspective view of a camera module according to an embodiment.

FIG. 4B is a perspective view of a camera module according to an embodiment.

Referring to FIG. 4B, according to an embodiment, the camera module 400 may discharge a part of heat emitted from the image sensor 230 to the outside of the camera module 400 through the protrusion 291 and discharge the remaining part of heat emitted from the image sensor 230 to the outside of the camera module 400 through the conductive pad 361. According to an embodiment, the camera module 400 may adjust the internal temperature by discharging heat generated from the image sensor 230 through the shield can 290 and the substrate 360. Referring to FIG. 4B, the camera module 400 has omitted the actuator 280 and the optical filter 201 to indicate an internal structure. The omitted actuator 280 and the optical filter 201 may be disposed in the region 401.

When the image sensor 230 or the image processor operates to convert light into an electrical signal, power may be consumed, and thus heat may be generated. Heat generated from the image sensor 230 or the image processor may be transferred to the conductive plate 270 through a portion of the conductive plate 270 in contact with the image sensor 230.

A portion of the heat transferred from the image sensor 230 to the conductive plate 270 may be transferred to the protrusion 291 electrically connected to the conductive plate 270. A portion of the heat transferred from the image sensor 230 to the conductive plate 270 may be transferred to the shield can 290 through the protruding part 291 and may be discharged to the outside of the camera module 400 through the shield can 290. The shield can 290 may have a surface area sufficient to dissipate heat. For example, the shield can 290 may have an outer surface in the shape of a box of a rectangular parallelepiped, and heat transferred through the protrusion 291 may flow along the surface area of the rectangular parallelepiped and may be discharged to the outside of the camera module 400.

The remaining part of the heat transferred from the image sensor 230 to the conductive plate 270 may be transferred to the conductive pad 361 electrically connected to the conductive plate 270. The remaining part of the heat transferred from the image sensor 230 to the conductive plate 270 may be transferred to the substrate 360 through the conductive pad 361 and may be discharged to the outside of the camera module 400 through the substrate 360.

For example, the conductive pad 361 may be connected to the copper foil of the substrate 360 to dissipate heat transferred from the camera module 400 and may be connected to another heat dissipation member (e.g., a support member, a heat dissipation member, or a housing formed of metal) disposed in the electronic device along the conductive material inside the substrate 360.

According to an embodiment, heat generated by the image sensor 230 may be emitted along a conduction path P. In an embodiment, the conduction path P may include a first path P1 as a path through which heat is emitted through the shield can 290, and a second path P2 as a path through which heat is emitted through the substrate 360.

The first path P1 may be formed so that heat generated from the image sensor 230 is transferred to the shield can 290 and discharged to the outside of the camera module 400 through the shield can 290. For example, the first path P1 may be formed such that heat emitted from the image sensor 230 is transferred to the shield can 290 along the conductive plate 270 and the protrusion 291 and then discharged through the shield can 290. The first path P1 is formed through the shield can 290 having a large surface area, thereby effectively dissipating heat generated from the image sensor 230.

The second path P2 may be formed so that heat generated from the image sensor 230 is transferred to the substrate 360 and discharged to the outside of the camera module 400 through the substrate 360. For example, the second path P2 may be formed so that heat emitted from the image sensor 230 is transferred to the substrate 360 along the conductive plate 270 and the conductive pad 361 and then discharged through the substrate 360 or a metal instrument or a heat dissipation member connected to the substrate 360. According to the above-described embodiment, the heat dissipation efficiency of the camera module 400 may be improved by discharging heat to the outside through the first path P1 and the second path P2.

A camera module that does not include a conductive plate is configured to address the radiation problem by grounding the shield can to the ground surface on the printed circuit board. In this case, since securing sufficient ground surface on the printed circuit board is difficult, radiation performance may be degraded. A camera module that does not contain a conductive plate may perform only a function of shielding the internal functions of the camera module without dissipating heat transferred from the camera module. A camera module that does not include a conductive plate is configured to solve the heat dissipation problem by dissipating heat generated from an image sensor through a printed circuit board. Since the area in which the printed circuit board is exposed to the outside is limited, securing sufficient heat dissipation performance may be difficult.

According to the above-described embodiment, the camera module 400 may improve radiation and heat dissipation functions through the conductive plate 270 disposed between the substrate 360 and the image sensor 230. The conductive plate 270 may simultaneously perform functions related to the improvement of the radiation performance of the shield can 290 and the heat dissipation of the camera module 400. The conductive plate 270 may function as an electrically ground surface by being electrically connected to the conductive pad 361. Since the shield can 290 is electrically connected to the conductive plate 270, the shield can 290 may have the same effect as being grounded to a ground surface corresponding to an area of the conductive plate 270. The camera module 400 according to the above-described embodiment may sufficiently secure a ground surface. The conductive plate 270 may adjust the temperature of the camera module 400 by discharging heat generated from the image sensor 230 to the outside of the camera module 400 through the shield can 290 and the substrate 360. A camera module that does not include a conductive plate emits heat only through the printed circuit board, but according to the above-described embodiment, the camera module 400 may have an excellent heat dissipation effect by including a first path P1 through which heat is emitted and a second path P2 through which heat is emitted through the substrate 360. According to the above-described embodiment, the electronic device may use the shield can 290 as a structure for heat dissipation while shielding the actuator 280.

Figure 5:
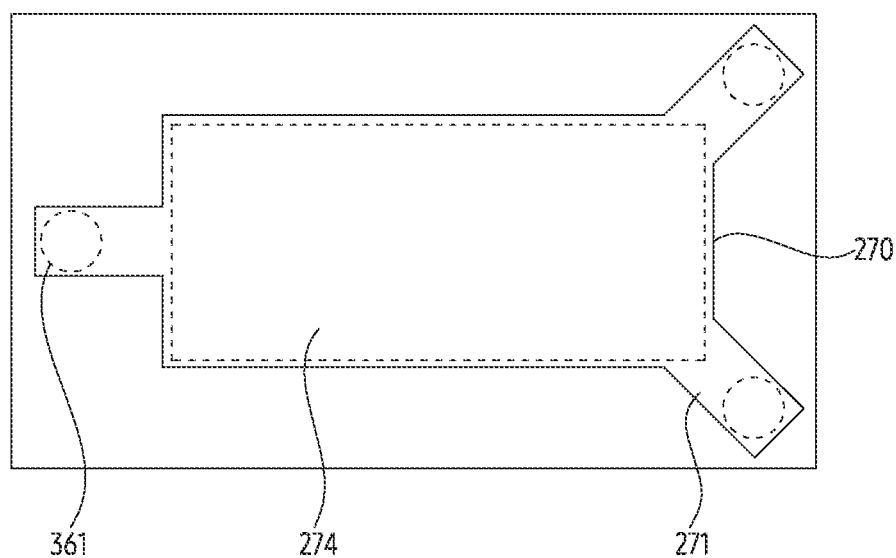
FIG. 5 is diagram illustrating an example in which a conductive plate is disposed on a printed circuit board of a camera module according to an embodiment.

FIG. 5 is a diagram illustrating an example in which a conductive plate is disposed on a printed circuit board of a camera module according to an embodiment.

Referring to FIG. 5, the conductive pad 361 may be spaced apart from the region 274 in which the image sensor 230 and the conductive plate 270 overlap. For example, when the image sensor 230 is viewed from above, the region 274 overlapping the image sensor 230 on the substrate 360 may be spaced apart from the periphery of the substrate 360. The conductive pad 361 may be disposed between the overlapping region 274 and the periphery of the substrate 360. For example, the substrate 360 is disposed at the center of the overlapping region 274, and three conductive pads 361 may be disposed between the overlapping region 274 and the periphery of the substrate 360. One of the three conductive pads 361 may be disposed on one side of the overlapping region 274, and the other two may be disposed on the other side of the overlapping region 274. Through the above-described arrangement structure, the substrate 360 may secure a space in which other devices may be mounted on the substrate 360 and may secure a separation distance between a plurality of conductive pads 361.

The conductive plate 270 may include a bridge 271 extending toward the conductive pad 361. The bridge 271 may be disposed at a position corresponding to the conductive pad 361 when the conductive plate 270 is disposed on the substrate 360. The bridge 271 may be in direct contact with the conductive pad 361. When the image sensor 230 is viewed from above, the bridge 271 may be configured to extend from the region 274 overlapping the image sensor 230 on the substrate 360 toward the conductive pad 361. For example, the bridge 271 may connect the conductive plate 270 and the conductive pad 361. The width of the overlapping region 274 may be wider than the width of the bridge 271. For example, the width of the overlapping region 274 may be formed to have a width corresponding to that of the image sensor 230, and the width of the bridge 271 may correspond to the width of the conductive pad 361.

The shield can 290 may be electrically connected to the bridge 271. For example, the protrusion 291 of the shield can 290 may protrude to contact the bridge 271, so that the protrusion 291 and the bridge 271 may be electrically connected to each other. The conductive pad 361 and the bridge 271 are electrically connected to each other, and the bridge 271 and the protrusion 291 are electrically connected to each other, so that the shield can 290 may be electrically connected to the conductive pad 361.

Through the bridge 271, a part of the heat generated from the image sensor 230 may be transferred to the shield can 290 through the bridge 271, and the remaining part may be transferred to the substrate 360. The bridge 271 may provide a path through which heat is transferred to the shield can 290 and the substrate 360. The upper portion of the bridge 271 may be in contact with at least a portion of the shield can 290, and the lower portion of the bridge 271 may be in contact with the conductive pad 361. After heat generated from the image sensor 230 is transferred to the bridge 271, a part of the heat may be discharged through the shield can 290 contacting the upper part of the bridge 271, and the remaining part of the heat may be discharged through the substrate 360 contacting the lower part of the bridge 271.

According to the above-described embodiment, the conductive plate 270 may include a bridge 271, and transfer heat emitted from the image processor to the bridge 271 through the overlapping region 274 while shielding the shield can 290 through the bridge 271. Heat transferred to the bridge 271 may be discharged to the outside through the shield can 290 or the printed circuit board 307 connected to the substrate.

Figure 6:
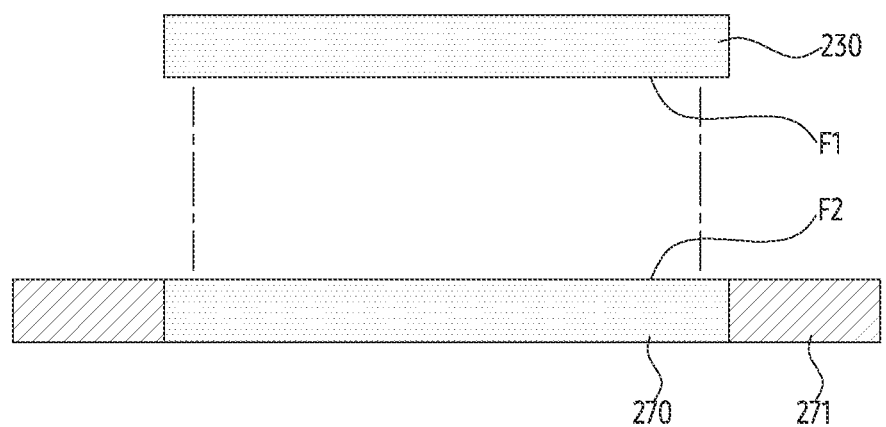
FIG. 6 is a diagram illustrating an image sensor and a conductive plate of a camera module according to an embodiment.

FIG. 6 is a diagram illustrating an image sensor and a conductive plate of a camera module according to an embodiment.

Referring to FIG. 6, the flatness F2 of one surface of the conductive plate 270 may correspond to the flatness F1 of the image sensor 230. The image sensor 230 may be disposed on one surface of the conductive plate 270. The flatness F2 of one surface of the conductive plate 270 facing the image sensor 230 may correspond to the flatness F1 of the image sensor 230 facing one surface of the conductive plate 270. The flatness F2 of one surface of the conductive plate 270 may refer, for example, to the flatness F2 of a portion of the conductive plate 270 in contact with the image sensor 230. For example, since the bridge 271 may not contact the image sensor 230, the flatness of the bridge 271 may not correspond to the flatness F1 of the image sensor 230. Since the flatness F2 of one surface of the conductive plate 270 corresponds to the flatness F1 of the image sensor 230, tilt that may occur in a process of arranging the image sensor 230 on the conductive plate 270 may be avoided.

In the case of a camera module that does not include a conductive plate, an image sensor is disposed on a printed circuit board. The ground surface of the printed circuit board may be uneven and irregular due to the surface tension of the photosensitive ink of the printed circuit board. The ground surface of the printed circuit board may be uneven and irregular due to the surface tension of the photosensitive ink of the printed circuit board. When seated on the printed circuit board, a tilt may occur in the image sensor, and warpage of the optical path of the camera module may occur by the tilt.

According to the above-described embodiment, since the flatness F2 of one surface of the conductive plate 270 disposed between the substrate 360 and the image sensor 230 corresponds to the flatness F1 of the image sensor 230, the camera module 400 may avoid tilt from occurring when the image sensor 230 is seated on one surface of the conductive plate 270. According to the above-described embodiment, as the image sensor 230 is stably mounted on one surface of the conductive plate 270, the camera module 400 may reduce twisting of the optical path and improve image quality.

According to the above-described embodiment, the camera module 400 may include a conductive plate 270 having rigidity in order to secure the flatness of the image sensor 230. While securing the flatness of the image sensor 230, the conductive plate 270 may secure shielding performance of the shield can through a ground member electrically connected to the conductive plate 270 and discharge heat emitted from the image sensor 230 to the outside of the camera module 400 through a heat dissipation member thermally connected to the conductive plate 270.

Figure 7A:
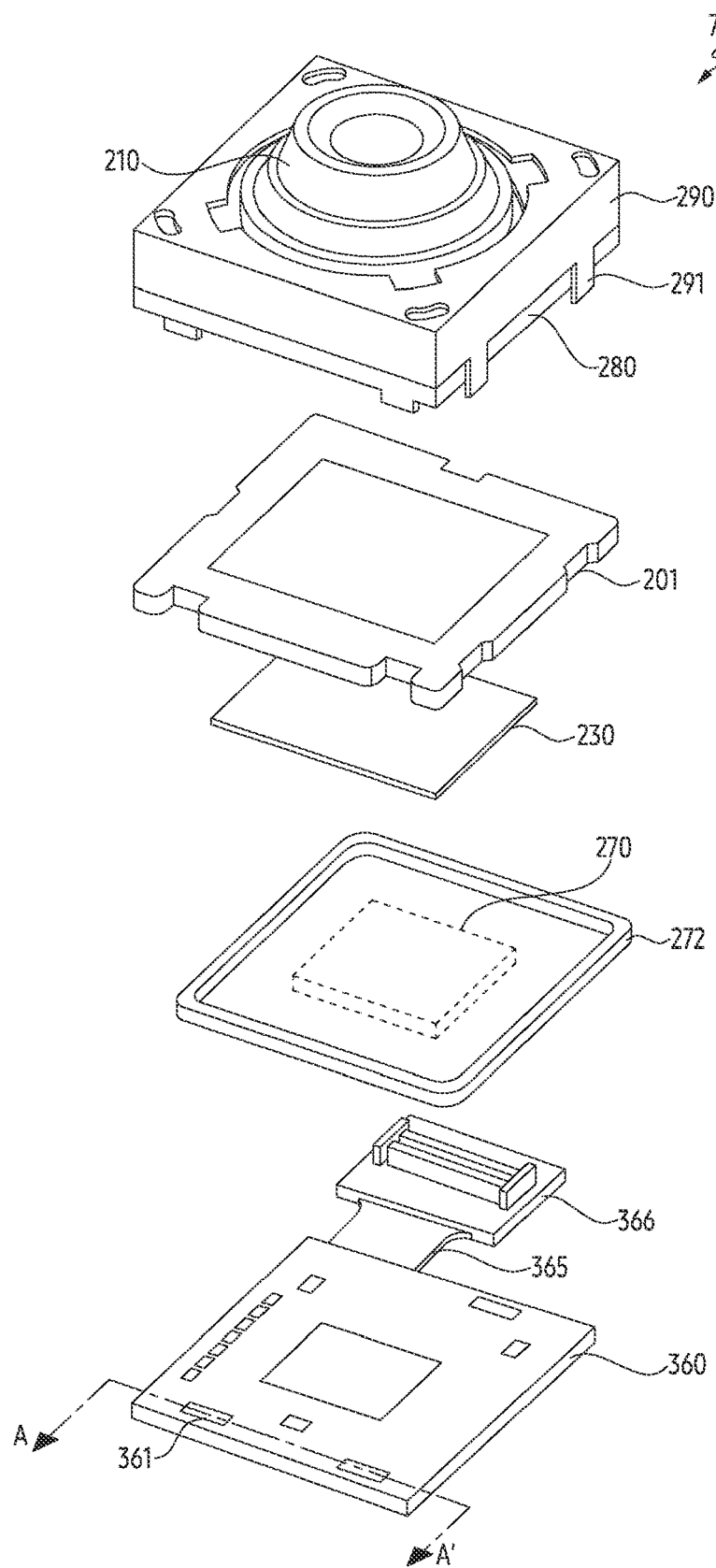
FIG. 7A is an exploded perspective view of a camera module according to an embodiment.
Figure 7B:
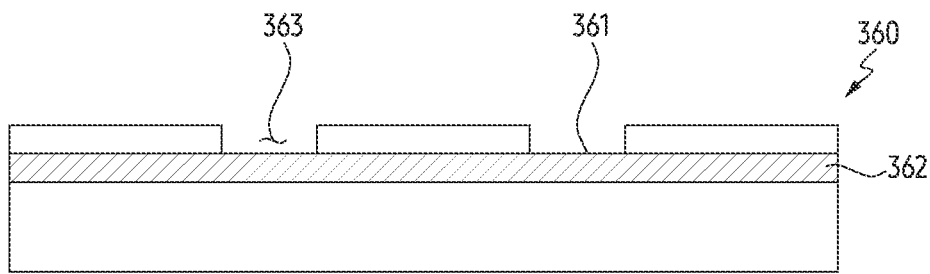
FIG. 7B is a cross-sectional view of the printed circuit board of the camera module taken along line A-A' of FIG. 7A according to an embodiment.
Figure 7C:
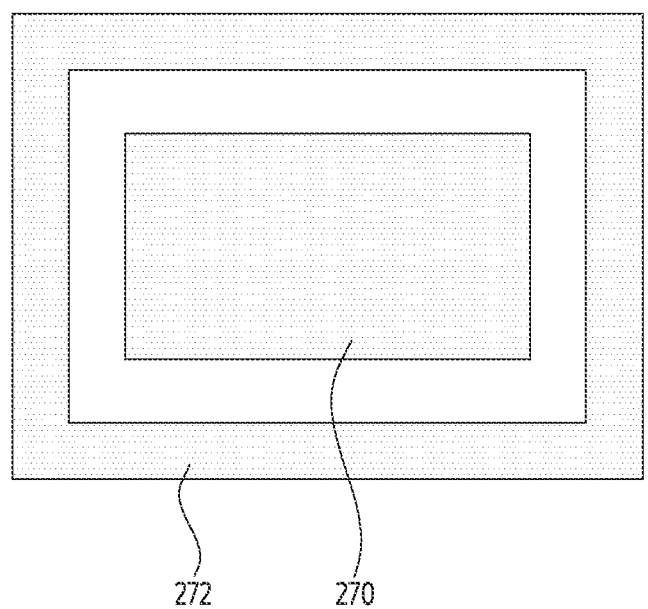
FIG. 7C is a diagram illustrating an example of a conductive plate and a conductive ring of a camera module according to an embodiment.

FIG. 7A is an exploded perspective view of a camera module according to an embodiment, FIG. 7B is a cross-sectional view of the printed circuit board of the camera module taken along line A-A' of FIG. 7A according to an embodiment, and FIG. 7C is a diagram illustrating an example of a conductive plate and a conductive ring of a camera module according to an embodiment.

Referring to FIGS. 7A and 7B, according to an embodiment, the camera module 700 may include a substrate 360, an image sensor 230 disposed on the substrate 360, a conductive ring 272 disposed between the substrate 360 and the image sensor 230, an actuator 280 adjusting the position of the lens assembly 210, and a shield can 290 surrounding the actuator 280. The camera module 700 may sequentially arrange the substrate 360, the image sensor 230, the optical filter 201, and the lens assembly 210 from the bottom. The substrate 360, the conductive ring 272, the optical filter 201, and the lens assembly 210 may be sequentially disposed. The conductive ring 272 and the image sensor 230 may be disposed on the substrate 360.

According to an embodiment, the camera module 700 may further include a conductive plate 270.

The image sensor 230 may be electrically connected in contact with the substrate 360. For example, the image sensor 230 may be disposed between the substrate 360 and the optical filter 201. The conductive ring 272 may surround the image sensor 230 along the periphery of the image sensor 230. However, the present disclosure is not limited thereto, and the image sensor 230 may contact the conductive plate 270 disposed on the substrate 360.

According to an embodiment, the substrate 360 may include a copper foil layer 362. The substrate 360 may include an opening 363 on one surface. The opening 363 formed on one surface of the substrate 360 may be configured to expose the copper foil layer 362 on one surface of the substrate 360. For example, the substrate 360 may expose a part of the copper foil layer 362 through the opening 363 by disposing a non-conductive layer on the copper foil layer 362, etching a part of the non-conductive layer and forming an opening 363.

According to an embodiment, the conductive pad 361 may be a portion of the copper foil layer 362 exposed through the opening 363. The copper foil layer 362 exposed through the opening 363 may function as a conductive pad 361. For example, the substrate 360 may include a plurality of rectangular openings 363 on one surface and may expose the copper foil layer 362 through the plurality of openings 363. According to an embodiment, the conductive ring 272 may electrically connect the shield can 290 and the exposed copper foil layer 362. The shield can 290 electrically connected to the copper foil layer 362 may electrically shield the actuator 280.

Referring to FIGS. 7A and 7C, according to an embodiment, the camera module 700 may include a conductive ring 272 disposed outside the conductive plate 270. The conductive ring 272 may be electrically connected to the conductive plate 270. For example, the conductive ring 272 and the conductive plate 270 may be electrically connected to each other through the substrate 360. The conductive ring 272 may have a ring shape in which a conductive plate 270 is disposed inside and extends along an outer circumference of the conductive plate 270. For example, the conductive ring 272 may include an accommodating part where the conductive plate 270 is disposed inside, and a body formed to be spaced apart from the conductive plate 270 disposed in the accommodating part. The conductive ring 272 may have a rectangular ring or circular ring shape.

The conductive ring 272 may be disposed in a region corresponding to the conductive pad 361. For example, the conductive ring 272 may be disposed on the copper foil layer 362 exposed through the opening 363 by being disposed in the opening 363 on the substrate 360. When disposed on the substrate 360, the conductive ring 272 may be disposed in a region corresponding to the conductive pad 361, thereby being electrically connected to the conductive pad 361. The conductive ring 272 may be disposed along the periphery of the substrate 360 in a region corresponding to the conductive pad 361. For example, a plurality of conductive pads 361 may be disposed between a region where the image sensor 230 is disposed on the substrate 360 and a periphery of the substrate 360, and the conductive ring 272 may be disposed on the conductive pad 361. A plurality of conductive pads 361 may be disposed along the periphery of the substrate 360, and the conductive ring 272 may be formed along the periphery of the substrate 360. When the conductive ring 272 is disposed on the substrate 360, the conductive ring 272 may be in contact with a plurality of conductive pads 361.

The conductive ring 272 may include a conductive material and a material having high thermal conductivity. For example, the conductive ring 272 may include a metal material steel having high electrical conductivity and thermal conductivity such as silver, copper, aluminum, or stainless, and may be made of the same material as the conductive plate 270.

Figure 7D:
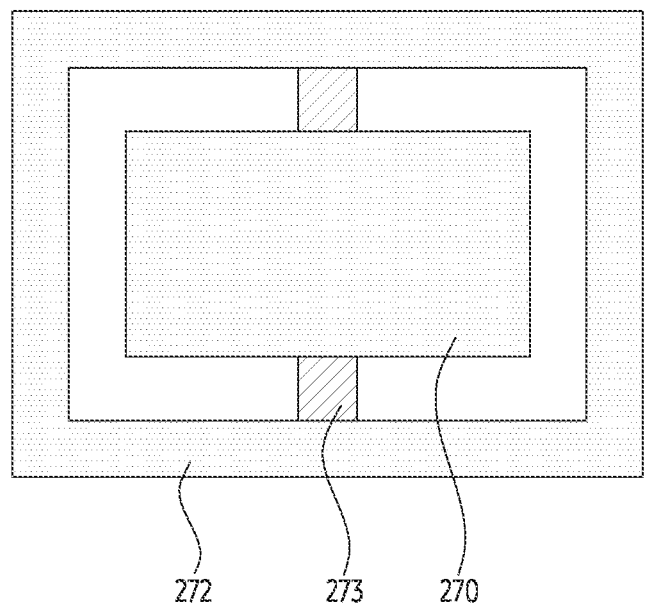
FIG. 7D is another diagram illustrating example of a conductive plate and a conductive ring of a camera module according to an embodiment.

FIG. 7D is another diagram illustrating an example of the conductive plate 270 and the conductive ring 272 of the camera module 700 according to an embodiment.

Referring to FIG. 7D, according to an embodiment, the camera module 700 may include a conductive member (e.g., conductive piece comprising a conductive material) 273 electrically connecting the conductive ring 272 and the conductive plate 270. The conductive member 273 may be disposed between the conductive plate 270 and the conductive ring 272 and may physically and electrically connect the conductive plate 270 and the conductive ring 272. One side of the conductive member 273 may be connected to the conductive plate 270 and the other side thereof may be connected to the conductive ring 272. A plurality of conductive members 273 may be disposed between the conductive plate 270 and the conductive ring 272. The conductive member 273 may include a conductive material. For example, the conductive member 273 may include a metal material such as silver, copper, or aluminum.

According to an embodiment, the conductive plate 270 may be electrically connected to the conductive pad 361 through the conductive ring 272. The conductive ring 272 may be disposed on the conductive pad 361, and the conductive member 273 may electrically connect the conductive ring 272 and the conductive plate 270. The conductive plate 270 may function as an electrically ground surface through the conductive ring 272 electrically connected to the conductive pad 361. The shield can 290 may be electrically connected to the conductive plate 270 which may function as an electrically ground surface, thereby being electrically grounded. For example, the protrusion 291 of the shield can 290 protrudes to be in contact with the conductive plate 270, thereby electrically connecting the shield can 290 and the conductive plate 270. For example, the shield can 290 may be electrically connected to the ground portion of the substrate 360 through the conductive ring 272.

According to an embodiment, the conductive ring 272 may be electrically connected to the shield can 290. For example, the protrusion 291 of the shield can 290 protrudes to contact the conductive ring 272, so that the protrusion 291 and the conductive ring 272 may be electrically connected to each other. As another example, the shield can 290 may be formed such that the lower surface thereof contacts along the conductive ring 272. The shield can 290 may be electrically connected to the conductive ring 272 disposed outside the conductive plate 270 to be electrically grounded. Since the conductive ring 272 is disposed outside the conductive plate 270, the conductive ring 272 may provide a structure that is easily electrically connected to the shield can 290 disposed outside the camera module 700. The shield can 290 may increase an electromagnetic wave shielding effect through a ground state electrically connected to the conductive plate 270 or the conductive ring 272.

According to the above-described embodiment, the camera module 700 includes a substrate 360 exposing the copper foil layer 362, and the shield can 290 surrounds the actuator 280 and is electrically connected to the substrate 360 through a conductive ring 272 electrically connected to the copper foil layer of the substrate 360, so that the actuator 280 may be shielded from the outside.

Since the conductive ring 272 connected to the conductive plate 270 may sufficiently ensure a contact part with the shield can 290, a heat diffusion path may be sufficiently ensured. Since heat generated from the image sensor 230 is easily transferred to the shield can 290, heat dissipation efficiency may be improved.

Figure 8A:
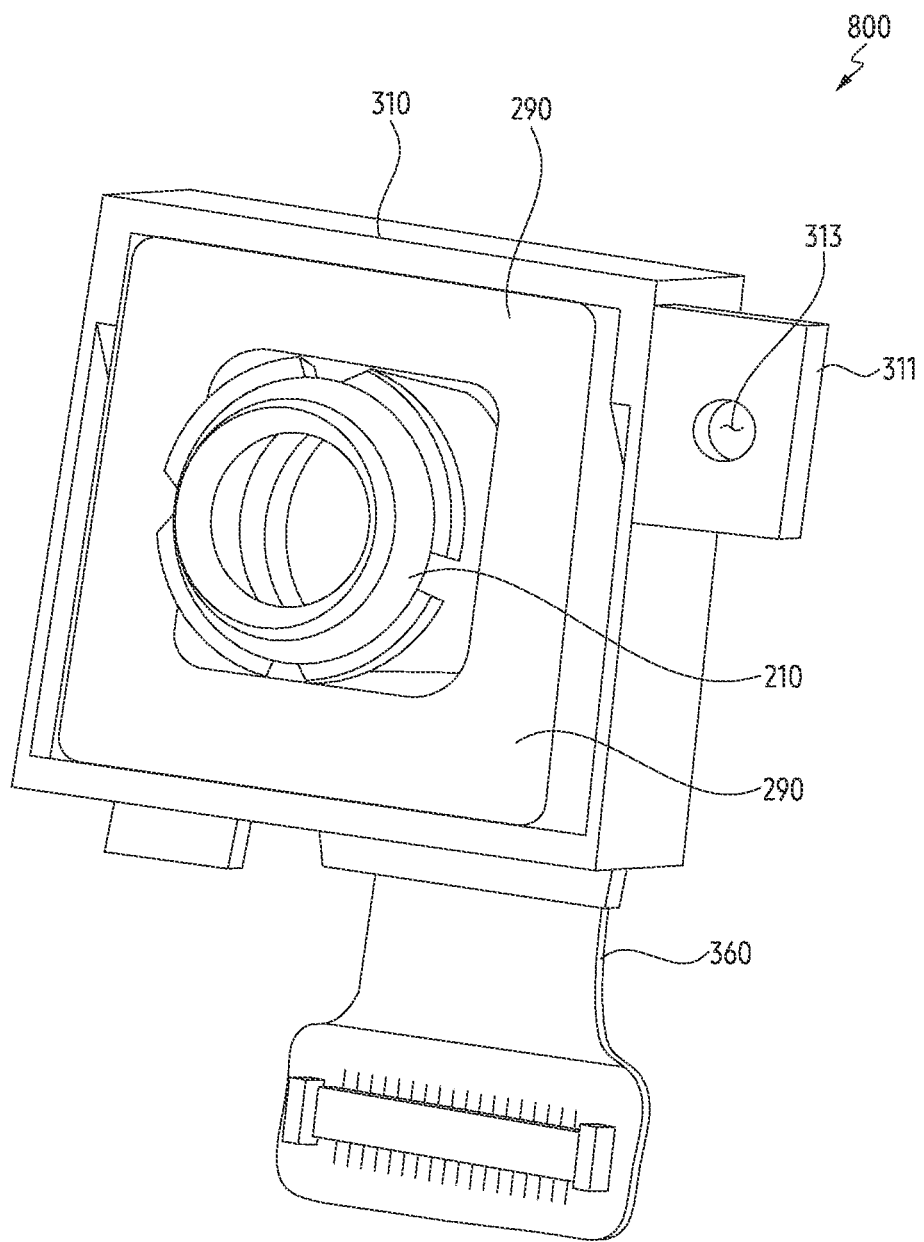
FIG. 8A is perspective view illustrating an example of a state in which a bracket is mounted on a camera module according to an embodiment.

FIG. 8A is a perspective view illustrating an example of a state in which a bracket is mounted on a camera module according to an embodiment.

Referring to FIG. 8A, according to an embodiment, the electronic device 101 may include a bracket 310 for supporting the camera module 800. At least one of the components of the camera module 800 may be the same as or similar to at least one of the components of the camera module 800 of FIGS. 4A and 4B, and a repeated description thereof may not be provided.

According to an embodiment, the camera module 800 may be accommodated in the bracket 310. The bracket 310 may be disposed inside the electronic device 101 to surround the camera module 800. For example, the bracket 310 may be disposed on the support member (e.g., the support member 305 of FIG. 3B), and the support member 305 may support the bracket 310. When the camera module 800 is surrounded by the bracket 310, a part of the lens assembly 210 may be exposed to the upper part of the bracket 310. For example, the bracket 310 may include an opening corresponding to the lens assembly 210, and a part of the lens assembly 210 may be exposed to the outside of the bracket 310 through the opening. The bracket 310 may accommodate the camera module 800 therein and be fixed to a specific position of the electronic device 101, thereby fixing the camera module 800 to the inside of the electronic device 101. For example, the bracket 310 may include a protrusion 311 including a through part 313 into which a fixing member (e.g., a fastener) may be inserted, and the fixing member may be inserted into the through part 313 to be fastened to the support member 305 of the electronic device 101.

Figure 8B:
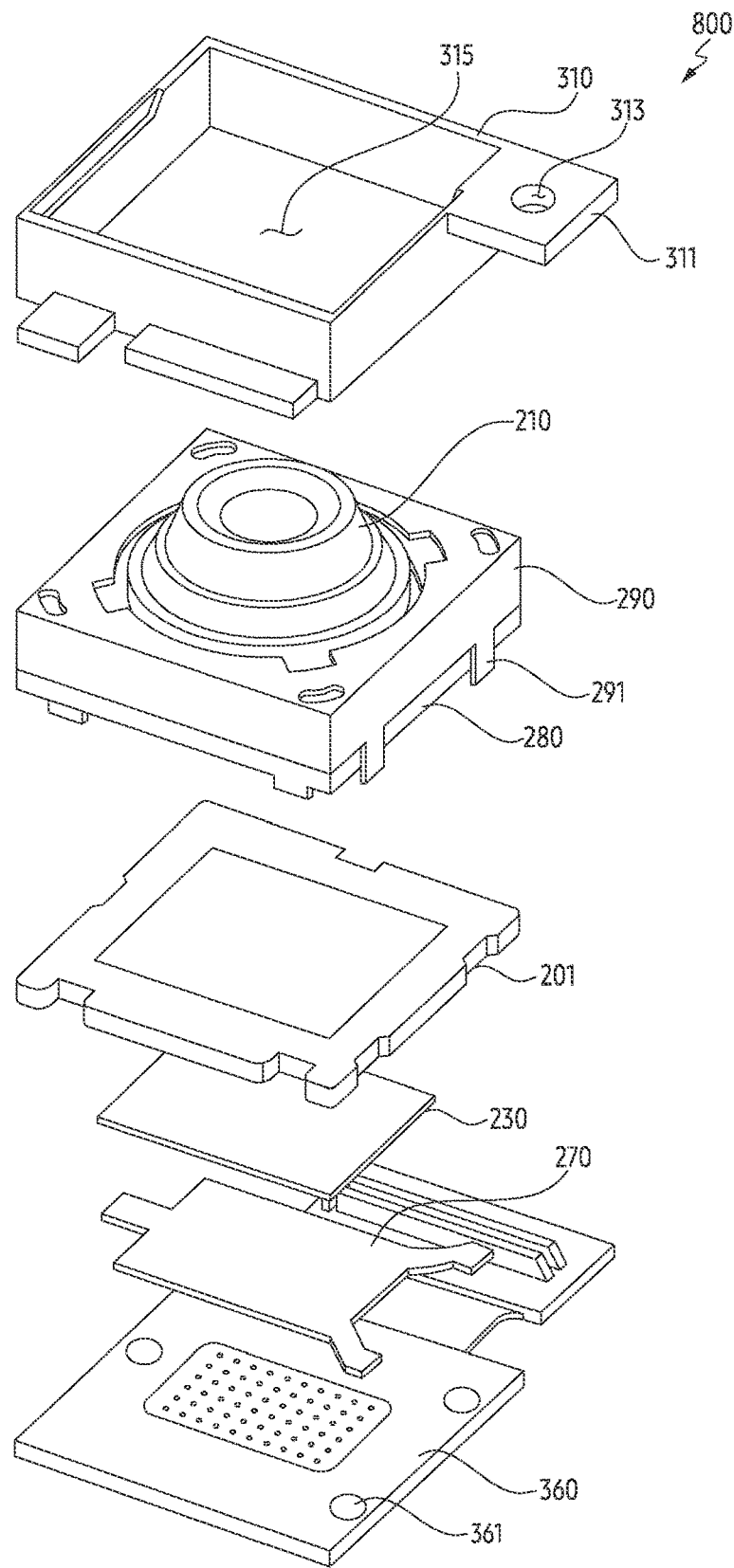
FIG. 8B is an exploded perspective view of a camera module and a bracket according to an embodiment.

FIG. 8B is an exploded perspective view of a camera module and a bracket according to an embodiment.

Referring to FIG. 8B, according to an embodiment, the camera module 800 may include a substrate 360, an image sensor 230 disposed on the substrate 360, a conductive plate 270 disposed between the substrate 360 and the image sensor 230, an actuator 280 that adjusts the position of the lens assembly 210 (e.g., the actuator 280 of FIG. 4A), a shield can 290 surrounding the actuator 280, and a bracket 310. In the camera module 800, a substrate 360, a conductive plate 270, an image sensor 230, an optical filter 201, and a lens assembly 210 may be sequentially disposed from the bottom.

According to an embodiment, the camera module 800 may include a bracket 310 disposed outside. The upper and lower surfaces of the bracket 310 may be opened, and the bracket 310 may include an accommodation space 315 in which the camera module 800 is accommodated. The bracket 310 may be in contact with the conductive plate 270 disposed on the substrate 360 from the upper portion of the camera module 800 to accommodate the camera module 800 in the accommodating space 315. The bracket 310 may have a fastening structure physically fastened to at least a portion of the camera module 800. For example, the inner surface of the accommodation space 315 of the bracket 310 may be formed in a shape corresponding to the overall appearance of the camera module 800.

According to an embodiment, the bracket 310 may be electrically connected to the conductive plate 270. The bracket 310 may be disposed such that a lower surface thereof contacts the conductive plate 270. The bracket 310 may be disposed such that a lower surface thereof contacts the conductive plate 270. The bracket 310 may be in contact with the conductive plate 270 on the conductive pad 361.

Figure 8C:
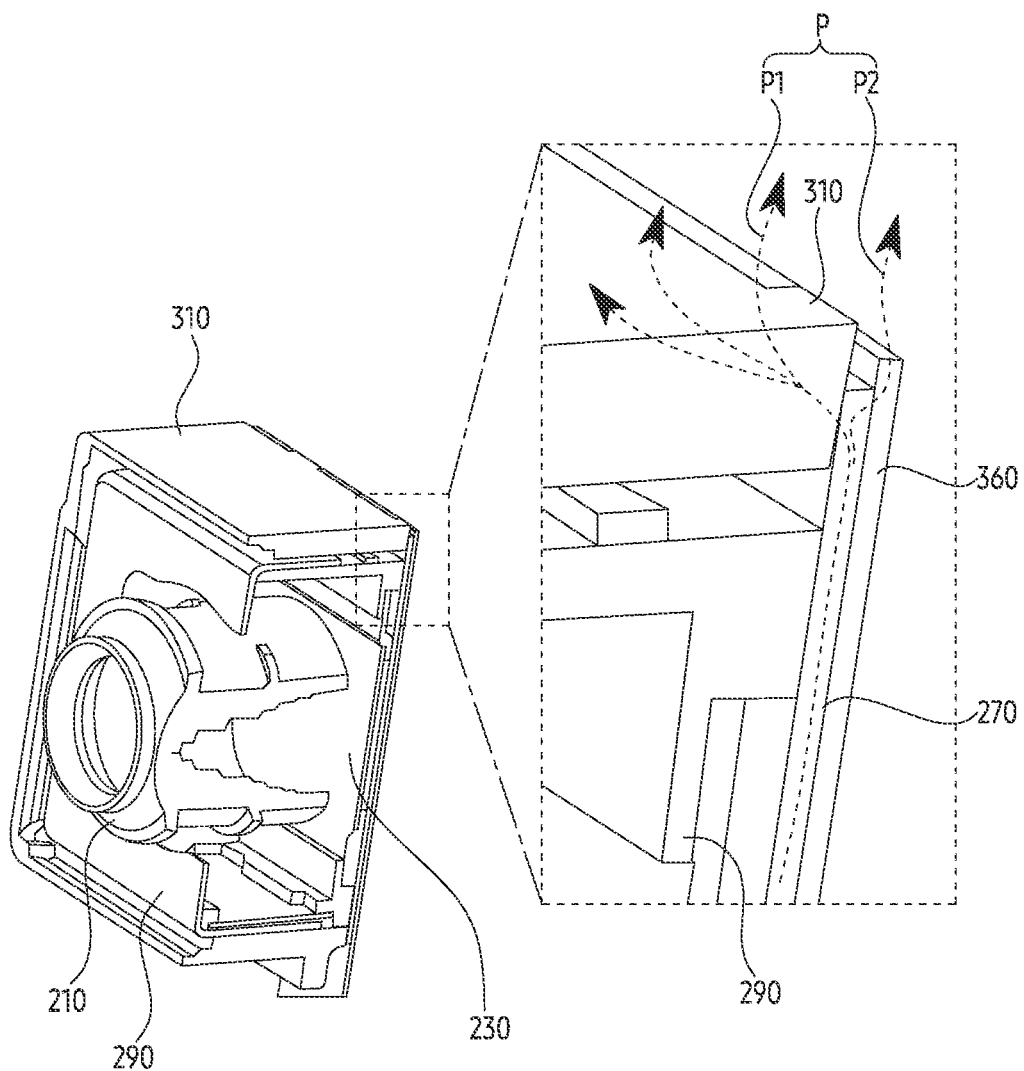
FIG. 8C is a sectional perspective view of a camera module and a bracket according to an embodiment.

FIG. 8C is a perspective sectional view of a camera module and a bracket according to an embodiment.

Referring to FIG. 8C, in an embodiment, the bracket 310 may be electrically connected to the conductive plate 270. At least a part of the lower surface of the bracket 310 may be in contact with the conductive plate 270. For example, the periphery of the conductive plate 270 may surround the periphery of the lower surface where the shield can 290 and the conductive plate 270 contact each other. A periphery of a surface where the bracket 310 and the conductive plate 270 are in contact may be disposed between a periphery of a lower surface where the shield can 290 and the conductive plate 270 are in contact and a periphery of the conductive plate 270. Since the bracket 310 is disposed to surround the shield can 290, a part of the lower surface of the bracket 310 may be in contact with the conductive plate 270. The bracket 310 may include a conductive material. For example, the bracket 310 may include copper and aluminum. The bracket 310 may function as an electrically ground surface by being electrically connected to the conductive plate 270 electrically connected to the conductive pad 361.

According to an embodiment, after heat generated by the image sensor 230 is transferred to the conductive plate 270, the part of the heat may be discharged to the outside through the bracket 310, and the other part of the heat may be discharged to the outside through the substrate 360.

A portion of the heat transferred from the image sensor 230 to the conductive plate 270 may be transferred to the bracket 310 in contact with the conductive plate 270. The bracket 310 may absorb heat from the conductive plate 270 and discharge the heat to the outside, thereby radiating the camera module 800. A part of the heat generated from the image sensor 230 may be transferred to the bracket 310 through the conductive plate 270 and then be discharged to the outside of the camera module 800 through the bracket 310.

The remaining portion of the heat transferred from the image sensor 230 to the conductive plate 270 may be transferred to the substrate 360 through the conductive pad 361 and may be discharged to the outside through the substrate 360. For example, heat emitted from the image sensor 230 or the image processor may be transferred to the conductive plate 270, transferred from the conductive plate 270 to the conductive pad 361, and transferred from the conductive pad 361 to the substrate 360 to be discharged to the outside of the camera module 800.

According to an embodiment, heat generated by the image sensor 230 may be emitted along the conduction path P. In an embodiment, the conduction path P may include a first path P1 as a path through which heat is emitted through the bracket 310 and a second path P2 as a path through the substrate 360.

The first path P1 may be formed so that heat generated from the image sensor 230 is transferred to the bracket 310 and discharged to the outside through the bracket 310. For example, the first path P1 may be formed so that heat emitted from the image sensor 230 is transferred to the bracket 310 through the conductive plate 270 and then discharged to the outside of the bracket 310. In the bracket 310, a plurality of heat dissipation fins may be disposed along the first path P1. Heat may be discharged to the outside through the radiating fins while flowing along the first path P1.

The second path P2 may be formed so that heat generated from the image sensor 230 is transferred to the substrate 360 and discharged to the outside of the camera module 800 through the substrate 360. For example, the second path P2 may be formed such that heat emitted from the image sensor 230 is transferred to the substrate 360 along the conductive plate 270 and the conductive pad 361, and then discharged through the substrate 360. Heat transferred from the image sensor 230 or the image processor to the substrate 360 may be discharged through the substrate 360 through an instrument structure or a heat dissipation member connected to the substrate 360.

According to an embodiment, the conductive plate 270 may be in contact with at least one of the shield can 290 and the bracket 310. The conductive plate 270 may discharge heat emitted from the image sensor 230 to the outside of the camera module 800 through at least one of the bracket 310 and the shield can 290. Heat generated from the image sensor 230 may be transferred to the conductive plate 270 and then discharged to the outside through at least one of the shield can 290 and the bracket 310. For example, heat generated from the image sensor 230 may be transferred to the conductive plate 270 and then simultaneously transferred to the shield can 290 and the bracket 310 and may be discharged to the outside through the shield can 290 and the bracket 310. According to an embodiment, the camera module 800 may emit heat generated from the image sensor 230 through the shield can 290 and the bracket 310, thereby ensuring a maximum heat dissipation area, thereby improving heat dissipation performance.

The camera module 800 according to the above-described embodiment may have an effect of increasing a heat dissipation area by dissipating heat to the outside through the shield can 290 and the bracket 310. The camera module 800 may efficiently emit heat transferred from the image sensor 230 or the image processor through a large heat dissipation area.

Figure 9A:
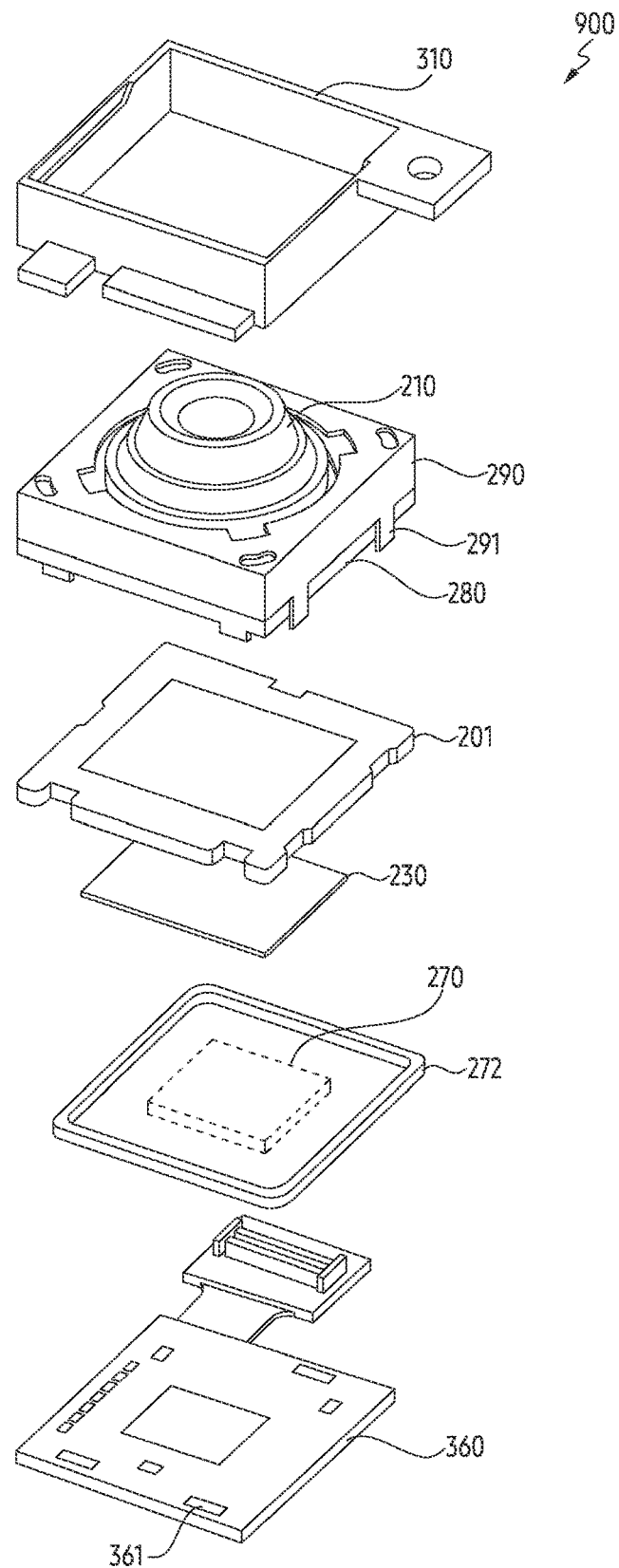
FIG. 9A is an exploded perspective view of a camera module and a bracket according to an embodiment.

FIG. 9A is an exploded perspective view of a camera module and a bracket according to an embodiment.

Referring to FIG. 9A, according to an embodiment, the camera module 900 may include a substrate 360, an image sensor 230 disposed on the substrate 360, a conductive ring 272 disposed between the substrate 360 and the image sensor 230, an actuator 280 adjusting the position of the lens assembly 210, and a shield can 290 surrounding the actuator 280. The camera module 900 may sequentially arrange the substrate 360, the image sensor 230, the optical filter 201, and the lens assembly 210 from the bottom. The substrate 360, the conductive ring 272, the optical filter 201, and the lens assembly 210 may be sequentially disposed. The conductive ring 272 and the image sensor 230 may be disposed on the substrate 360.

According to an embodiment, the camera module 900 may further include a conductive plate 270.

The image sensor 230 may be electrically connected in contact with the substrate 360. For example, the image sensor 230 may be disposed between the substrate 360 and the optical filter 201. The conductive ring 272 may surround the image sensor 230 along the periphery of the image sensor 230. However, the present disclosure is not limited thereto, and the image sensor 230 may contact the conductive plate 270 disposed on the substrate 360.

According to an embodiment, the camera module 900 may include a bracket 310 disposed outside. The bracket 310 may contact the conductive plate 270 disposed on the substrate 360 from the top of the camera module 900 to accommodate the components of the camera module 900 therein.

According to an embodiment, the bracket 310 may be electrically connected to the conductive plate 270. The bracket 310 may be disposed such that a lower surface thereof contacts the conductive plate 270. The bracket 310 may be disposed on the conductive plate 270 at a position corresponding to the conductive pad 361 (e.g., the bridge 271 of FIG. 4B). The bracket 310 may be in contact with the conductive plate 270 on the conductive pad 361.

According to an embodiment, the conductive ring 272 may be electrically connected to the conductive pad 361, and the bracket 310 may be electrically connected to the conductive ring 272. The conductive ring 272 may have a lower surface in contact with the conductive pad 361, and an upper surface thereof may be in contact with a lower surface of the bracket 310. Accordingly, the bracket 310 may be electrically connected to the conductive pad 361 through the conductive ring 272.

Figure 9B:
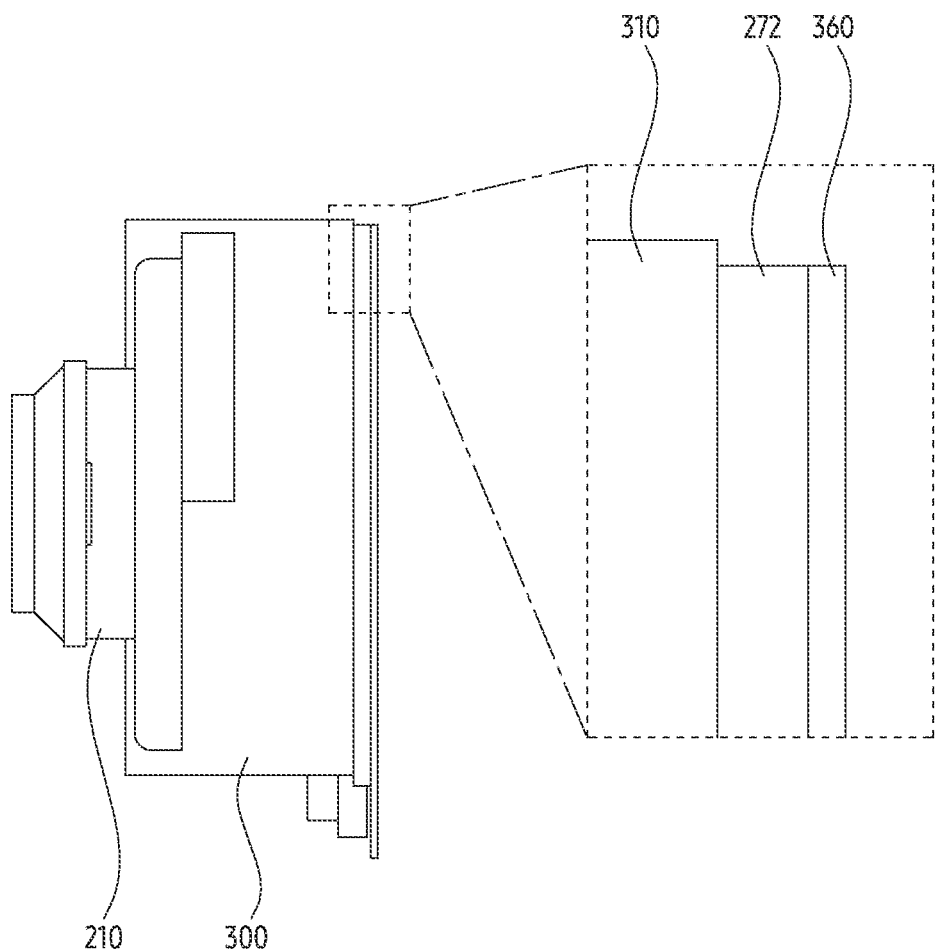
FIG. 9B is a diagram illustrating a side view of a camera module and a bracket according to an embodiment.

FIG. 9B is a diagram illustrating side view of a camera module and a bracket according to an embodiment.

Referring to FIG. 9B, in an embodiment, the conductive ring 272 may be disposed between the bracket 310 and the substrate 360. The bracket 310 may accommodate the shield can 290 therein and may contact the upper surface of the conductive ring 272. When the components of the camera module 900 are disposed in the bracket 310, the bracket 310 may be electrically grounded by contacting the lower surface of the bracket 310 with the upper surface of the conductive ring 272. For example, the bracket 310 may be electrically connected to the substrate 360 through the conductive ring 272 and may be grounded through electrical connection with the ground portion of the substrate 360.

According to an embodiment, heat generated by the image sensor 230 may be transferred to the bracket 310 and the substrate 360 through the conductive ring 272 and may be discharged to the outside from the bracket 310 and the substrate 360. For example, heat generated by the image sensor 230 may be transferred to the conductive ring 272 through the conductive plate 270. A part of the heat transferred to the conductive ring 272 may be transferred to the bracket 310 disposed to contact the upper surface of the conductive ring 272, and then may be discharged to the outside while flowing along the bracket 310. The remaining part of the heat transferred to the conductive ring 272 may flow along the substrate 360 disposed to contact the lower surface of the conductive ring 272 and may be discharged to the outside.

Figure 10:
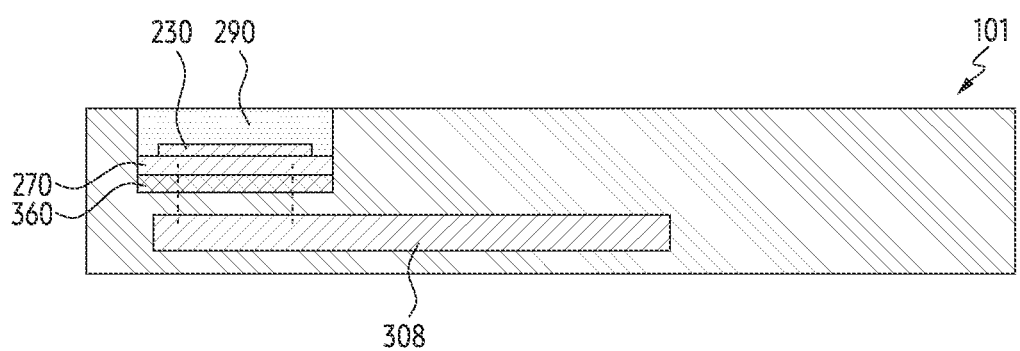
FIG. 10 is a cross-sectional view of an electronic device according to an embodiment.

FIG. 10 is a cross-sectional view of an electronic device according to an embodiment.

Referring to FIG. 10, according to an embodiment, the electronic device 101 may include a heat dissipation member 308. The heat dissipation member 308 may be thermally connected to the conductive plate 270 and may absorb heat from the conductive plate 270 and discharge or cool it. For example, the heat dissipation member 308 may emit heat generated from the image sensor 230 through the substrate 360 connected to the conductive plate 270 and the heat transfer member connected to the substrate 360. The electronic device 101 may include a heat dissipation member 308 such as a heat pipe, a heat sink, a support member (e.g., the support member 305 of FIG. 3B) inside the electronic device 101 or an instrument.

According to an embodiment, the electronic device 101 may dissipate heat generated by the image sensor 230 through the heat dissipation member 308. The conductive plate 270 may receive heat generated from the image sensor 230 by contact with the image sensor 230. Heat transferred to the conductive plate 270 may be transferred to the heat dissipation member 308 connected to the conductive plate 270. The conductive plate 270 and the heat dissipation member 308 may be in physical direct contact with each other. For example, the heat dissipation member 308 may be disposed to contact at least a part of the side surface or the bottom surface of the conductive plate 270, and the heat dissipation member 308 may receive heat through a part contacting the conductive plate 270. For another example, the electronic device 101 may include a heat transfer member made of a metal material such as a nichrome wire connected to the conductive plate 270 and the heat dissipation member 308, and the heat dissipation member 308 may receive heat from the conductive plate 270 through the heat transfer member.

The heat dissipation member 308 may cool the heat transferred from the conductive plate 270. For example, the heat dissipation member 308 may be a heat pipe in the form of a thin metal including copper or aluminum, and the heat pipe may cool the heat through heat exchange with a refrigerant flowing inside the heat pipe. As another example, the heat dissipation member 308 may be a metal instrument supporting electronic components in the electronic device 101, and the metal instrument may absorb heat from the conductive plate 270 by being disposed to contact the conductive plate 270. According to an embodiment, the electronic device 101 may perform heat dissipation of the camera module 180 by cooling the heat generated from the image sensor 230 through the heat dissipation member 308 connected to the conductive plate 270.

Figure 11A:
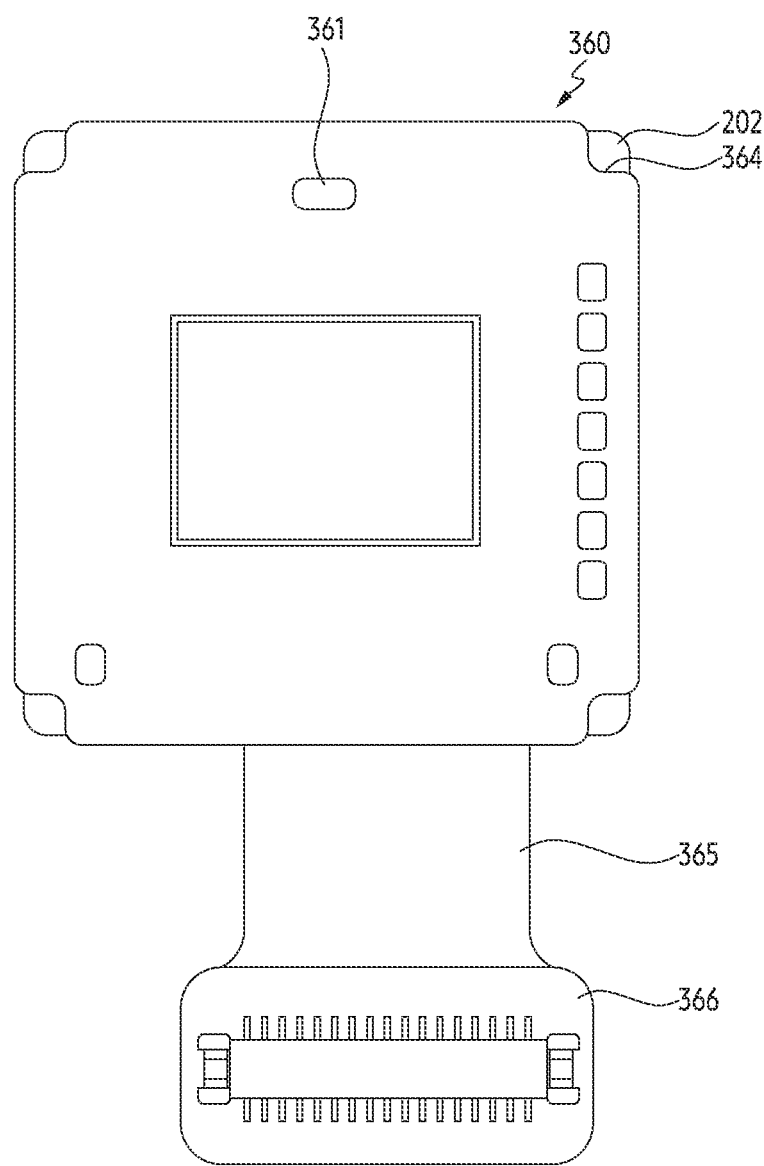
FIG. 11A is a diagram illustrating a front view of a printed circuit board according to an embodiment.
Figure 11B:
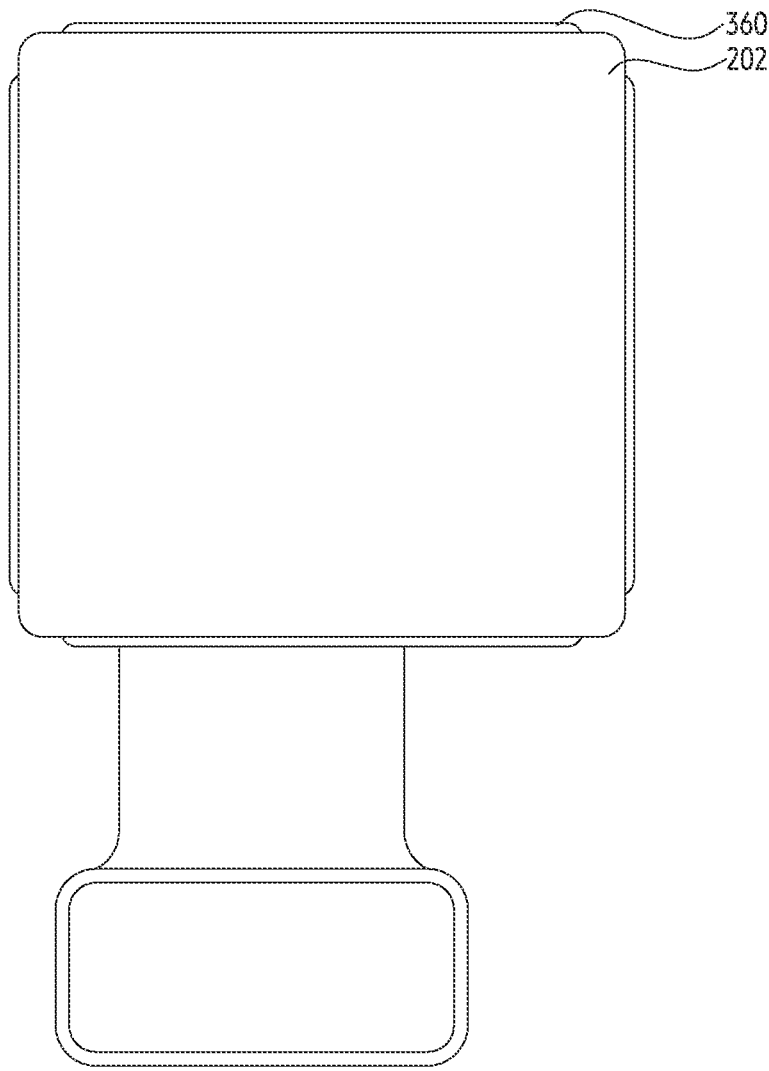
FIG. 11B is a diagram illustrating a rear view of a printed circuit board according to an embodiment.

FIG. 11A is diagram illustrating a front view of a printed circuit board according to an embodiment, and FIG. 11B is a diagram illustrating a rear view of the printed circuit board according to an embodiment.

Referring to FIGS. 11A and 11B, the camera module 180 according to an embodiment may further include a stiffener 202 supporting the substrate 360. The stiffener 202 may provide rigidity to the substrate 360 by supporting the substrate 360. For example, the substrate 360 may be a flexible printed circuit board using a flexible insulating substrate or a rigid flexible printed circuit board (RFPCB), and the stiffener 202 may be disposed on a flexible portion of the flexible printed circuit board or the rigid flexible printed circuit board. The stiffener 202 may be a thin plate including aluminum, stainless steel, polyimide, and Woven glass and epoxy (FR-4). The stiffener 202 may reinforce the hardness and flatness of the flexible region of the flexible printed circuit board and absorb electromagnetic waves. The surface of the substrate 360 facing the image sensor 230 may correspond to the surface of the image sensor 230 facing the substrate 360 by enhancing the hardness of the flexible region using the stiffener 202.

According to an embodiment, the stiffener 202 may be disposed on the rear surface of the substrate 360. The substrate 360 may include an indentation portion 364 dented inward from the corner. For example, the indentation portion 364 may be formed in a shape in which four corners of the rectangular substrate 360 are partially dented inward. The stiffener 202 disposed on the rear surface of the substrate 360 may be exposed to one surface of the substrate 360 through the indentation portion 364.

According to an embodiment, the stiffener 202 may be electrically connected to the substrate 360. For example, the substrate 360 may expose a copper foil layer positioned inside the substrate 360 on the rear surface, and the stiffener 202 may be connected to the copper foil layer by a conductive adhesive. The conductive adhesive may be a conductive tape or a conductive bond. The stiffener 202 may be disposed on the rear surface of the substrate 360 and electrically connected to the conductive pad 361 through the inside of the substrate 360. The stiffener 202 may be electrically connected to the conductive pad 361 to function as a ground surface.

Figure 11C:
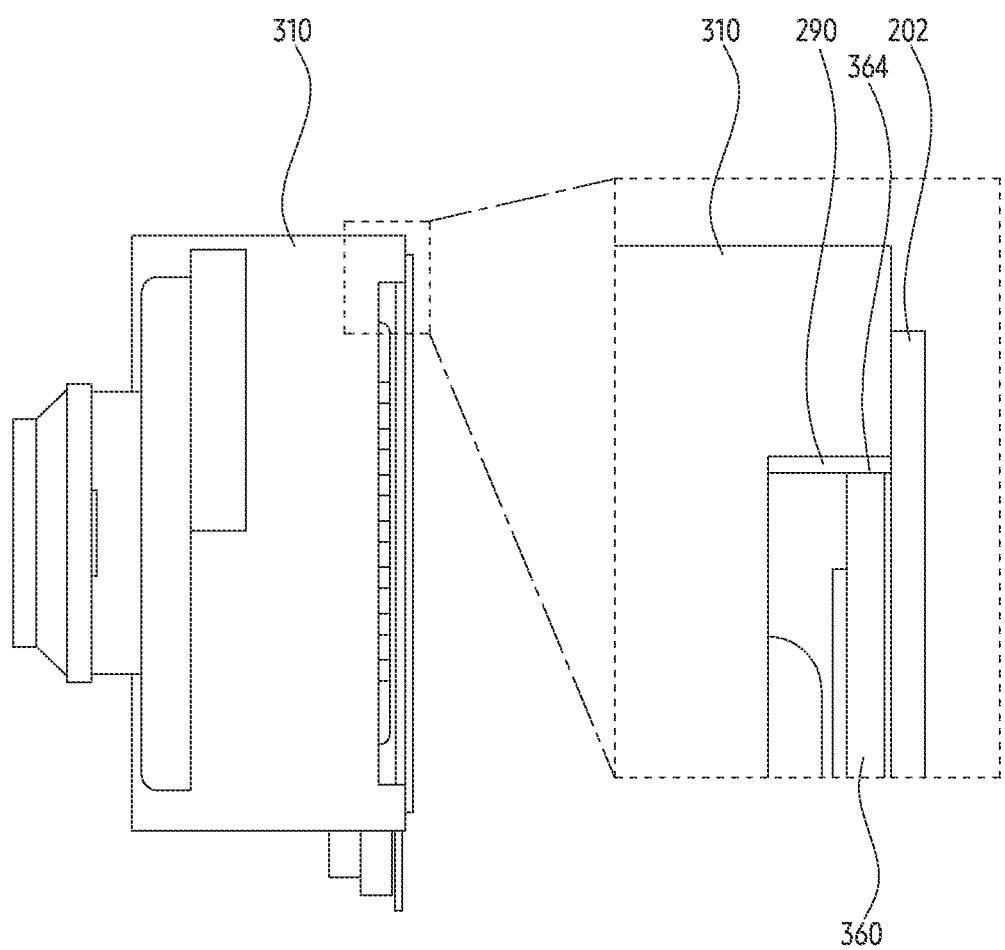
FIG. 11C is a diagram illustrating a side view of a camera module and a bracket according to an embodiment.

FIG. 11C is a diagram illustrating a side view of the camera module 180 and the bracket 310 according to an embodiment.

Referring to FIG. 11C, in an embodiment, at least one of the shield can 290 and the bracket 310 may be disposed to contact at least a portion of the stiffener 202. For example, at least one of the shield can 290 and the bracket 310 may extend to the indentation portion 364 of the substrate 360 and may contact the stiffener 202 exposed to one surface of the substrate 360 through the indentation portion 364. The stiffener 202 electrically connected to the shield can 290 and/or the bracket 310 may function as a ground surface. According to an embodiment, the camera module 180 may improve an electromagnetic wave shielding function by securing a sufficient ground area.

According to an embodiment, heat generated from the image sensor 230 may be transferred to at least one of the shield can 290 and the bracket 310 through the stiffener 202 and then emitted to the outside of the camera module 180. Heat generated from the image sensor 230 may be transferred to the stiffener 202 through the conductive plate 270 and the substrate 360, and then may flow to at least one of the shield can 290 and the bracket 310 in contact with the stiffener 202 to be discharged to the outside of the camera module 180. The stiffener 202 may perform a heat dissipation function by sufficiently securing a ground area of the shield can 290 and the bracket 310 and transferring heat to the shield can 290 and the bracket 310.

According to an example embodiment, a camera module (e.g., the camera module 400 of FIG. 4A) may comprise: a printed circuit board (e.g., the substrate 360 of FIG. 4A) including a conductive pad (e.g., the conductive pad 361 of FIG. 4A) exposed on one surface of the printed circuit board; an image sensor (e.g., the image sensor 230 of FIG. 4A) disposed on the printed circuit board; a conductive plate (e.g., the conductive plate 270 of FIG. 4A) disposed between the printed circuit board and the image sensor and electrically connected to the conductive pad; an actuator (e.g., the actuator 280 of FIG. 4A) disposed above the image sensor and configured to adjust a position of a lens assembly; a shield can (e.g., the shield can 290 of FIG. 4A) surrounding the actuator and electrically connected to the conductive plate; wherein the conductive plate may be configured to release heat generated from the image sensor to an outside of the camera module by contact with the image sensor.

According to an example embodiment, a camera module (e.g., the camera module 400 of FIG. 4A) may comprise: a printed circuit board (e.g., the substrate 360 of FIG. 4A) including a conductive pad (e.g., the conductive pad 361 of FIG. 4A) exposed on one surface of the printed circuit board; an image sensor (e.g., the image sensor 230 of FIG. 4A) disposed on the printed circuit board; a conductive plate (e.g., the conductive plate 270 of FIG. 4A) disposed between the printed circuit board and the image sensor and electrically connected to the conductive pad; an actuator (e.g., the actuator 280 of FIG. 4A) disposed above the image sensor and configured to adjust a position of a lens assembly; a shield can (e.g., the shield can 290 of FIG. 4A) surrounding the actuator and electrically connected to the conductive plate; wherein the conductive plate may be configured to emit heat generated from the image sensor to an outside of the camera module by contact with the image sensor.

According to an example embodiment, the conductive plate may be configured to emit a portion of heat generated from the image sensor to the outside of the camera module through a protrusion, and to emit a remaining portion of heat generated from the image sensor to the outside of the camera module through the conductive pad.

According to an example embodiment, heat generated by the image sensor may be configured to be emitted along a conduction path (e.g., the conduction path P of FIG. 4B), wherein the conduction path may include a first path (e.g., the first path P1 of FIG. 4B) through which heat generated from the image sensor is emitted through the conductive plate, the protrusion, and the shield can; and a second path (e.g., the second path P2 of FIG. 4B) through which heat generated from the image sensor is emitted through the conductive plate, the conductive pad, and the printed circuit board.

According to an example embodiment, when the image sensor is viewed from above, an area overlapping the image sensor (e.g., the area 274 overlapping the image sensor of FIG. 5) on the printed circuit board may be spaced apart from a periphery of the printed circuit board, wherein the conductive pad may be disposed between the overlapping area and the periphery of the printed circuit board.

According to an embodiment, the conductive plate in contact with the image sensor may include a bridge (e.g., bridge 271 of FIG. 5) extending from the conductive plate toward the conductive pad, wherein a flatness of one surface of the conductive plate facing the image sensor corresponds to a flatness of the image sensor.

According to an example embodiment, the shield can may be electrically connected to the bridge.

According to an example embodiment, the camera module may further comprise: a stiffener (e.g., the stiffener 202 of FIG. 11A) comprising a reinforcing plate supporting the printed circuit board and electrically connected to the conductive pad, wherein the shield can may be electrically connected to the stiffener.

According to an example embodiment, the stiffener may be disposed on a rear surface of the printed circuit board, wherein the shield can may include a protrusion (e.g., protrusion 291 of FIG. 4A) electrically connected to the stiffener by at least a part of the shield can extending to the stiffener.

According to an example embodiment, the printed circuit board may include an indentation portion (e.g., indentation portion 364 of FIG. 11A) indented inward from a corner, wherein a part of the stiffener may be electrically connected to the protrusion in a portion exposed through the indentation portion on the rear surface of the printed circuit board.

According to an example embodiment, the printed circuit board may include a copper foil layer (e.g., the copper foil layer 362 of FIG. 7B) and an opening (e.g., the opening 363 of FIG. 7B) formed on the one surface, wherein the conductive pad may include a portion of the copper foil layer exposed through the opening.

According to an example embodiment, the camera module may further comprise: a conductive ring (e.g., the conductive ring 272 of FIG. 7A) disposed on the outside of the conductive plate and electrically connected to the conductive plate; wherein the conductive ring may be disposed along a periphery of the printed circuit board in region corresponding to the conductive pad.

According to an example embodiment, an electronic device (e.g., the electronic device 101 of FIG. 1) may comprise: a camera module (e.g., the camera module 800 of FIG. 8B) including a camera mounted on the electronic device; a support (e.g., the support member 305 of FIG. 3B) disposed to surround the camera module and supporting a bracket (e.g., bracket 310 of FIG. 8B) configured to fix the camera module to an inside of the electronic device, wherein the camera module may include a conductive pad exposed on one surface of a printed circuit board; an image sensor (e.g., the image sensor 230 of FIG. 8B), disposed on the printed circuit board (e.g., the substrate 360 of FIG. 8B); a conductive plate (e.g., the conductive plate 270 of FIG. 8B) disposed between the printed circuit board and the image sensor and electrically connected to the conductive pad; an actuator (e.g., the actuator 280 of FIG. 8B), disposed above the image sensor and configured to adjust a position of a lens assembly; a shield can surrounding the actuator, wherein the conductive plate may be electrically connected to the bracket and may be configured to emit heat generated from the image sensor to an outside of the camera module by contact with the image sensor.

According to an example embodiment, the shield can may be electrically connected to the conductive plate, wherein the conductive plate may be configured to emit heat emitted from the image sensor through at least one of the bracket and the shield can to the outside of the camera module According to an example embodiment, the conductive plate may be configured to emit a portion of heat generated from the image sensor to the outside of the camera module through the bracket, and to emit a remaining portion of heat generated from the image sensor to the outside of the camera module through the conductive pad.

According to an example embodiment, heat generated by the image sensor may be configured to be emitted along a conduction path (e.g., the conduction path P of FIG. 8C), wherein the conduction path may include a first path (e.g., the first path P1 of FIG. 8C) through which heat generated from the image sensor is emitted through the conductive plate and the bracket; and a second path (e.g., the second path P2 of FIG. 8C) through which heat generated from the image sensor is emitted through the conductive plate, the conductive pad, and the printed circuit board.

According to an example embodiment, the conductive plate in contact with the image sensor may include a bridge extending from the conductive plate toward the conductive pad, wherein a flatness of one surface of the conductive plate facing the image sensor corresponds to a flatness of the image sensor, wherein the bracket may be electrically connected to the bridge.

According to an example embodiment, the camera module may further comprise: a stiffener (e.g., the stiffener 202 of FIG. 11A) comprising a reinforcing plate supporting the printed circuit board and electrically connected to the conductive pad, wherein the bracket may be electrically connected to the stiffener.

According to an example embodiment, the printed circuit board may include a copper foil layer and an opening formed on one surface, wherein the conductive pad may include a portion of the copper foil layer exposed through the opening.

According to an example embodiment, the camera module may further comprise a heat dissipation member (e.g., the heat dissipating member 308 of FIG. 10) comprising a thermally conductive material connected to the conductive plate and configured to emit heat transmitted from the image sensor.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or emitted elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A camera module comprising:
    a printed circuit board (PCB), the PCB including a conductive pad exposed through a portion of the PCB;
    an image sensor;
    a conductive plate, contacted on the conductive pad, disposed between the PCB and the image sensor; and
    a shield can spaced apart from the image sensor, the shield can including:
        a first portion disposed over the image sensor, and
        a second portion extending from the first portion of the shield can to the conductive plate,
    wherein the conductive plate is contacted with both the image sensor and the second portion of the shield can to thermally connect the image sensor to the shield can through the conductive plate.

2. The camera module of claim 1, wherein the second portion of the shield can includes a protrusion contacted with the conductive plate.

3. The camera module of claim 2, wherein the conductive plate is configured to conduct a portion of heat caused from the image sensor to an outside of the camera module through the protrusion, and to conduct another portion of heat caused from the image sensor to outside of the camera module through the conductive pad.

4. The camera module of claim 3, wherein heat caused from the image sensor is configured to be conducted along a conduction path, the conduction path including:

a first path through which the portion of heat caused from the image sensor is conducted through the conductive plate, the protrusion, and the shield can, and a second path through which the other portion of heat caused from the image sensor is conducted through the conductive plate, the conductive pad, and the PCB.

5. The camera module of claim 1, wherein, when the image sensor is viewed from above, an overlapping area of the image sensor on the PCB is spaced apart from a periphery of the PCB, and wherein the conductive pad is disposed between the overlapping area and the periphery of the PCB.

6. The camera module of claim 1, wherein the conductive plate includes a bridge contacted with the conductive pad, and wherein a flatness of one surface of the conductive plate facing the image sensor corresponds to a flatness of the image sensor.

7. The camera module of claim 6, wherein the shield can is contacted with the bridge.

8. The camera module of claim 1, further comprising a stiffener comprising a reinforcing plate supporting the PCB and contacted with the conductive pad, wherein the shield can is contacted with the stiffener.

9. The camera module of claim 8, wherein the stiffener is disposed on a rear surface of the PCB, and wherein the shield can includes a protrusion contacted with the stiffener.

10. The camera module of claim 9, wherein the PCB includes an indentation portion indented inward from a corner, and wherein the protrusion is contracted with a portion of the stiffener exposed through the indentation portion on the rear surface of the PCB.

11. The camera module of claim 1, wherein the PCB includes a copper foil layer and an opening formed on one surface of the PCB, and wherein the conductive pad includes a portion of the copper foil layer exposed through the opening.

12. The camera module of claim 11, further comprising a conductive ring disposed on an outside of the conductive plate and electrically connected to the conductive plate, wherein the conductive ring is disposed along a periphery of the PCB in region corresponding to the conductive pad.

13. An electronic device comprising:

a camera module including:
 a printed circuit board (PCB), the PCB including a conductive pad exposed through a portion of the PCB,
 an image sensor,
 a conductive plate, contacted on the conductive pad, disposed between the PCB and the image sensor, and
 a shield can spaced apart from the image sensor, the shield can including:
  a first portion disposed over the image sensor, and
  a second portion extending from the first portion of the shield can to the conductive plate; and
 a support disposed to surround the camera module and supporting a bracket configured to fix the camera module to an inside of the electronic device, wherein the conductive plate is contacted with both the image sensor and the second portion of the shield can to thermally connect the image sensor to the shield can through the conductive plate.

14. The electronic device of claim 13, wherein the shield can is contacted with the conductive plate, and wherein the conductive plate is configured to conduct heat caused from the image sensor through at least one of the bracket and the shield can to an outside of the camera module.

15. The electronic device of claim 13, wherein the conductive plate is configured to conduct a portion of heat caused from the image sensor to an outside of the camera module through the bracket, and to emit another portion of heat caused from the image sensor to outside of the camera module through the conductive pad.

16. The electronic device of claim 15, wherein heat caused by the image sensor is configured to be conducted along a conduction path, the conduction path including:

a first path through which the portion of heat caused from the image sensor is conducted through the conductive plate and the bracket; and a second path through which heat caused from the image sensor is conducted through the conductive plate, the conductive pad, and the PCB.

17. The electronic device of claim 13, wherein the conductive plate includes a bridge contacted with the conductive pad, wherein a flatness of one surface of the conductive plate facing the image sensor corresponds to a flatness of the image sensor, and wherein the bracket is contacted with the bridge.

18. The electronic device of claim 13, wherein the camera module includes a stiffener comprising a reinforcing plate supporting the PCB and contacted with the conductive pad, and the bracket is contacted with the stiffener.

19. The electronic device of claim 13, wherein the PCB includes a copper foil layer and an opening formed on one surface of the PCB, and the conductive pad includes a portion of the copper foil layer exposed through the opening.

20. The electronic device of claim 13, wherein the camera module includes a heat dissipation member comprising a thermally conductive material contacted with the conductive plate and configured to conduct heat caused from the image sensor.

* * * * *